United States Patent
Suzuki et al.

(10) Patent No.: US 12,463,498 B2
(45) Date of Patent: Nov. 4, 2025

(54) CIRCUIT CONNECTION DEVICE, ROTATING ELECTRIC DEVICE, AND CIRCUIT CONNECTION DEVICE MANUFACTURING METHOD

(71) Applicant: Mitsubishi Electric Corporation, Tokyo (JP)

(72) Inventors: Junya Suzuki, Tokyo (JP); Yoshihiko Onishi, Tokyo (JP); Isao Sonoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 143 days.

(21) Appl. No.: 18/290,387

(22) PCT Filed: Jul. 28, 2021

(86) PCT No.: PCT/JP2021/027826
§ 371 (c)(1),
(2) Date: Nov. 13, 2023

(87) PCT Pub. No.: WO2023/007598
PCT Pub. Date: Feb. 2, 2023

(65) Prior Publication Data
US 2024/0258872 A1    Aug. 1, 2024

(51) Int. Cl.
*H02K 5/22* (2006.01)
*H01R 12/58* (2011.01)

(52) U.S. Cl.
CPC ........... *H02K 5/225* (2013.01); *H01R 12/585* (2013.01); *H01R 2201/10* (2013.01)

(58) Field of Classification Search
CPC ... H02K 5/225; H01R 12/585; H01R 2201/10
See application file for complete search history.

(56) References Cited

U.S. PATENT DOCUMENTS

2021/0218312 A1    7/2021   Motoda et al.

FOREIGN PATENT DOCUMENTS

| DE | 102013209315 B4 * | 1/2023 | .......... H05K 7/2039 |
| JP | 2005-302614 A | 10/2005 | |

OTHER PUBLICATIONS

Extended European Search Report dated Sep. 3, 2024 in Application No. 21951806.5.

* cited by examiner

*Primary Examiner* — Viet P Nguyen
(74) *Attorney, Agent, or Firm* — Sughrue Mion, PLLC

(57) ABSTRACT

A circuit connection device includes a connector having press-fit terminals, a circuit board that has terminal through holes formed, and the press-fit terminals are press-inserted into the terminal through holes, a terminal alignment member having a terminal guide that has guide through holes formed, where the guide through holes guide the press-fit terminals towards the terminal through holes, and a heat sink that has an opening which houses the terminal guide on an inside. First positioning protrusions are formed on one of the connector or the heat sink, and first positioning recesses are formed on the other thereof. Second positioning protrusions are formed on one of the circuit board or the terminal alignment member, and second positioning recesses are formed on the other thereof. Third positioning protrusions are formed on one of the heat sink or the terminal alignment member, and third positioning recesses are formed on the other thereof.

18 Claims, 9 Drawing Sheets

CIRCUIT CONNECTION DEVICE, ROTATING ELECTRIC DEVICE, AND CIRCUIT CONNECTION DEVICE MANUFACTURING METHOD

CROSS REFERENCE TO RELATED APPLICATIONS

This application is a National Stage of International Application No. PCT/JP2021/027826 filed Jul. 28, 2021.

TECHNICAL FIELD

The present disclosure relates to a circuit connection device, a rotating electric device, and circuit connection device manufacturing method.

BACKGROUND ART

Conventionally, a circuit connection device that has a circuit board and has a connector is used as a control unit of a rotating electric device. Press-fit terminals are used in a connection of the circuit board and the connector. By press-inserting the press-fit terminals of the connector into terminal through holes of the circuit board, it is possible to insure an electrical connection between the circuit board and the connector without the need to conduct soldering or the like.

A heat sink may be provided to cool electronic components that are mounted on the circuit board. When the heat sink is provided between the circuit board and the connector, since an interval between the circuit board and the connector increases, it becomes difficult to press-insert the press-fit terminals into the terminal through holes. In Patent Document 1, a terminal alignment member is attached to the circuit board so as to facilitate insertion of the press-fit terminals into the terminal through holes. Guide through holes are formed on the terminal alignment member so as to guide the press-fit terminals into the terminal through holes. To facilitate insertion of the press-fit terminals into the guide through holes, an insertion guide hole that inclines and expands as the insertion guide hole moves towards an open end of a connector side of the guide through holes is provided on an end of the connector side of the guide through hole.

CITATION LIST

Patent Document

[Patent Document 1] Japanese Unexamined Patent Application, First Publication No. 2005-302614.

SUMMARY OF INVENTION

Problem to be Solved by the Invention

When assembling a circuit connection device having a construction of the device in Patent Document 1, in a case where a relative position of a connector and a circuit board is offset from a reference position, there is a chance that tips of press-fit terminals collide with guide through holes of a terminal alignment member and/or surroundings thereof. As a result, there is a chance that a quality of the circuit connection device decreases due to buckling or the like of the press-fit terminals.

To prevent collision of the press-fit terminals and the guide through holes, a radius of openings of the guide through holes may be made larger. Also, by making an angle of inclination of an insertion guide hole smaller, it is possible to prevent the press-fit terminals from buckling. However, if the radius of openings of the guide through holes are made larger, there is a need to make a disposition interval of the guide through holes larger, which impels the need to make the disposition interval of the press-fit terminals and the terminal through holes larger. By making the angle of inclination of the insertion guide holes smaller, in order to form the terminal through holes of a desired size, the need to make a thickness of the terminal alignment member larger arises. As a result, a size of the circuit connection device needs to be increased as a result.

The present disclosure has been made in order to address the problem above, and an object is to provide a circuit connection device, a rotating electric device, and a circuit connection device manufacturing method that have improved assemblability, while optimizing a downsizing thereof.

Means to Solve the Problem

A circuit connection device according to the present disclosure includes: a connector having connection terminals that are connected to an outside of the circuit connection device, and press-fit terminals that are connected to the connection terminals; a circuit board that has terminal through holes formed, and the press-fit terminals are press-inserted into the terminal through holes; a terminal alignment member having a terminal guide that has guide through holes formed, where the guide through holes guide the press-fit terminals towards the terminal through holes, and the terminal alignment member is fixed to the circuit board while being disposed between the connector and the circuit board; and a heat sink that has an opening which houses the terminal guide on an inside of the opening, and the opening penetrates from a first surface to a second surface, where the circuit board is fixed to the first surface, and the connector is connected to the second surface that is on an opposite side of the first surface. First positioning protrusions are formed on one of the connector or the heat sink, and first positioning recesses that mate with the first positioning protrusions are formed on the other of the connector or the heat sink. Second positioning protrusions are formed on one of the circuit board or the terminal alignment member, and second positioning recesses that mate with the second positioning protrusions are formed on the other of the circuit board or the terminal alignment member. Third positioning protrusions are formed on one of the heat sink or the terminal alignment member, and third positioning recesses that mate with the third positioning protrusions are formed on the other of the heat sink or the terminal alignment member.

A rotating electric device according to the present disclosure includes a rotating electric machine and the circuit connection device that controls the rotating electric machine.

A method of manufacturing a circuit connection device according to the present disclosure wherein the circuit connection device includes: a connector having connection terminals that are connected to an outside of the circuit connection device, and press-fit terminals that are connected to the connection terminals; a circuit board that has terminal through holes formed, and the press-fit terminals are press-inserted into the terminal through holes; a terminal alignment member having a terminal guide that has guide through holes formed, where the guide through holes guide the press-fit terminals towards the terminal through holes, and the terminal alignment member is fixed to the circuit board while being disposed between the connector and the circuit board; and a heat sink that has an opening which houses the terminal guide on an inside of the opening, and the opening penetrates from a first surface to a second surface, where the circuit board is fixed to the first surface, and the connector is connected to the second surface that is on an opposite side of the first surface, wherein first positioning protrusions are formed on one of the connector or the heat sink, and first positioning recesses that mate with the first positioning protrusions are formed on the other of the connector or the heat sink, second positioning protrusions are formed on one of the circuit board or the terminal alignment member, and second positioning recesses that mate with the second positioning protrusions are formed on the other of the circuit board or the terminal alignment member, and third positioning protrusions are formed on one of the heat sink or the terminal alignment member, and third positioning recesses that mate with the third positioning protrusions are formed on the other of the heat sink or the terminal alignment member, the manufacturing method comprises: a first step of mating the second positioning protrusions with the second positioning recesses, and of fixing the terminal alignment member to the circuit board; a second step of mating the third positioning protrusions with the third positioning recesses, of housing the terminal guide on an inside of the opening, and of fixing the terminal alignment member to the heat sink, and a third step of mating the first positioning protrusions with the first positioning recesses, of inserting the press-fit terminals into the guide through holes while press-fitting the press-fit terminals into the terminal through holes, and of fixing the connector to the heat sink.

Effects of the Invention

According to the present disclosure, it is possible to provide a circuit connection device, a rotating electric device, and a circuit connection device manufacturing method that have improved assemblability, while optimizing a downsizing thereof.

DESCRIPTION OF EMBODIMENTS

First Embodiment

Hereinafter, a circuit connection device 2 and a rotating electric device A according to a first embodiment are explained with reference to the drawings.

Figure 1:
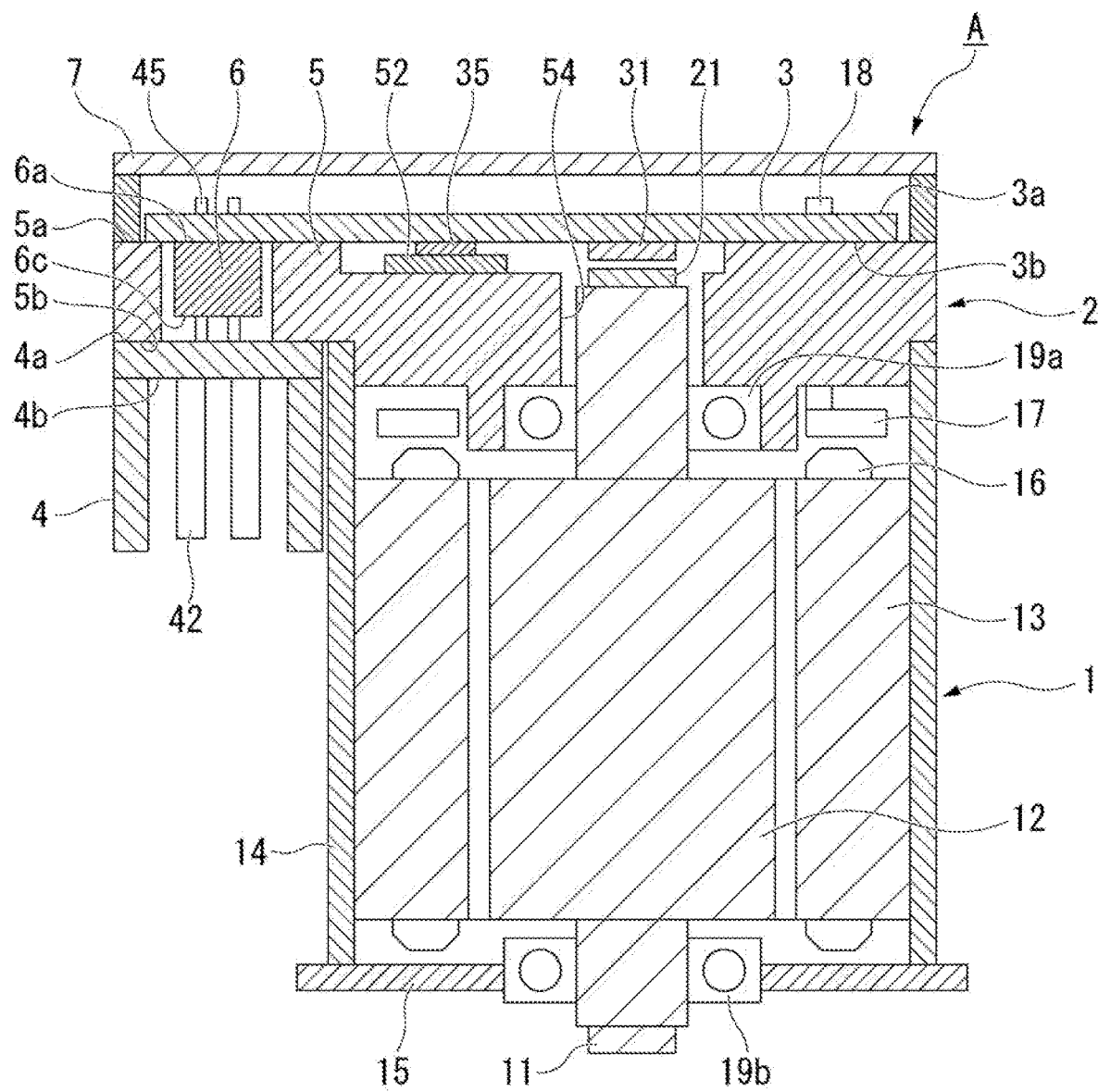
FIG. 1 A schematic cross-sectional view of a rotating electric device according to a first embodiment.

FIG. 1 is a schematic cross-sectional view of a rotating electric device A. The rotating electric device A includes a multi-phase winding type rotating electric machine 1, and the circuit connection device 2 that controls the rotating electric machine 1.

The rotating electric machine 1 is mainly configured of a rotating shaft 11, a rotor 12, a stator 13, a case 14, a lid 15, windings 16, annular wiring 17, wiring terminals 18, and first and second bearings 19a, and 19b. FIG. 1 is a cross-sectional view of the rotating electric device A along the rotating shaft 11. In FIG. 1, a bottom side of the page is an output side of rotating shaft 11, and a top side of the page is a non-output side of rotating shaft 11.

The rotating shaft 11 extends along a center axis of rotating electric machine 1. The rotor 12 is fixed to the rotating shaft 11. A plurality of pairs of permanent magnets (not shown) are disposed on an outer circumferential surface of the rotor 12. The permanent magnets configure a field pole.

The stator 13 is provided so as to surround an outer circumference of the rotor 12. The stator 13 is fixed to an inner surface of case 14. An air gap is formed between the outer circumferential surface of the rotor 12 and an inner circumferential surface of the stator 13. The air gap is formed throughout an entire circumference in a circumferential direction surrounding a center axis of rotating shaft 11.

The case 14 is cylindrically shaped. The case 14 houses the rotating shaft 11, the rotor 12, and the stator 13. The lid 15 covers a bottom end of the case 14. A top end of the case 14 is covered by a heat sink 5 of the circuit connection device 2 to be mentioned later on.

The windings 16 are wound to the stator 13. The windings 16 include U phase windings, V phase windings, and W phase windings.

The annular wiring 17 is disposed on the non-output side of the rotating shaft 11 (in other words, a top side that is shown in FIG. 1) with respect to the windings 16. The annular wiring 17 are connected to ends of windings 16 by TIG welding or the like.

The wiring terminals 18 are connected to the annular wiring 17. The wiring terminals 18 penetrate the heat sink 5, and extend to the non-output side of rotating shaft 11 from the annular wiring 17. The wiring terminals 18 are electrically connected to the ends of the windings 16 through the annular wiring 17. The wiring terminals 18 are configured of three conductors. Each of the three conductors is connected to wiring terminals of the U phase windings, wiring terminals of the V phase windings, and wiring terminals of the W phase windings of the windings 16. The wiring terminals 18 are connected to a circuit board 3 of the circuit connection device 2 to be mentioned later on by soldering or the like.

A first bearing 19a is provided on an end of the non-output side of rotating shaft 11 (a top end in FIG. 1). A second bearing 19b is provided on an end of the output side of rotating shaft 11 (a bottom end in FIG. 1). The first bearing 19a and the second bearing 19b support the rotating shaft 11 such that the rotating shaft 11 is able to freely rotate.

The first bearing 19a is fixed to the heat sink 5. The second bearing 19b is fixed to the lid 15.

A sensor rotor 21 is fixed to an end surface of the non-output side of rotating shaft 11. The sensor rotor 21 rotates with the rotation of the rotating shaft 11. The sensor rotor 21 includes one pair, or a plurality of pairs of permanent magnets.

Figure 2:
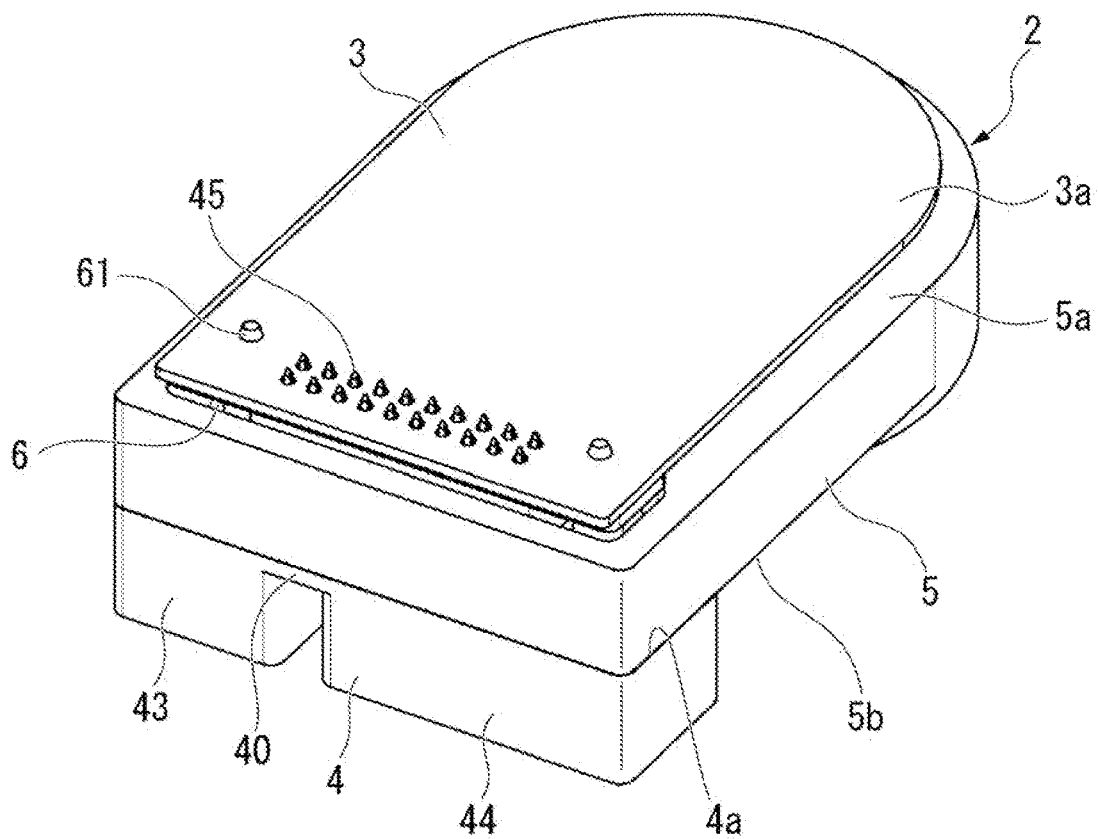
FIG. 2 An inclined view of a circuit connection device according to the first embodiment.

FIG. 2 is an inclined view of the circuit connection device 2 according to the first embodiment.

As shown in FIG. 1 and FIG. 2, the circuit connection device 2 has the circuit board 3, the connector 4, the heat sink 5 provided between the circuit board 3 and the connector 4, a terminal alignment member 6 that is provided between the circuit board 3 and the connector 4, and that is fixed to the circuit board 3, and a cover 7 that covers the circuit board 3 and the heat sink 5. FIG. 2 shows a state where the cover 7 is removed. The circuit connection device 2 in the present embodiment, is a control unit that controls current flow to the windings 16 of the rotating electric machine 1.

Figure 3:
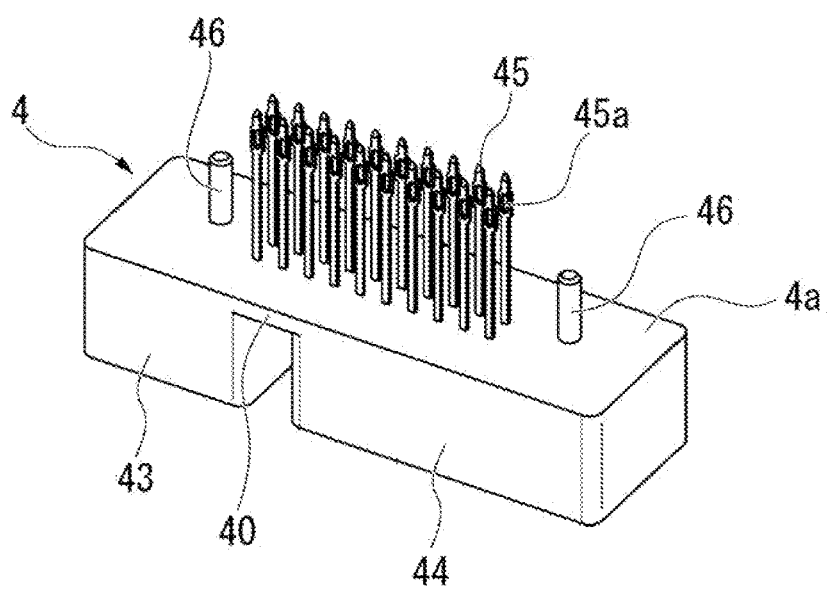
FIG. 3 An inclined view of a connector according to the first embodiment.
Figure 4:
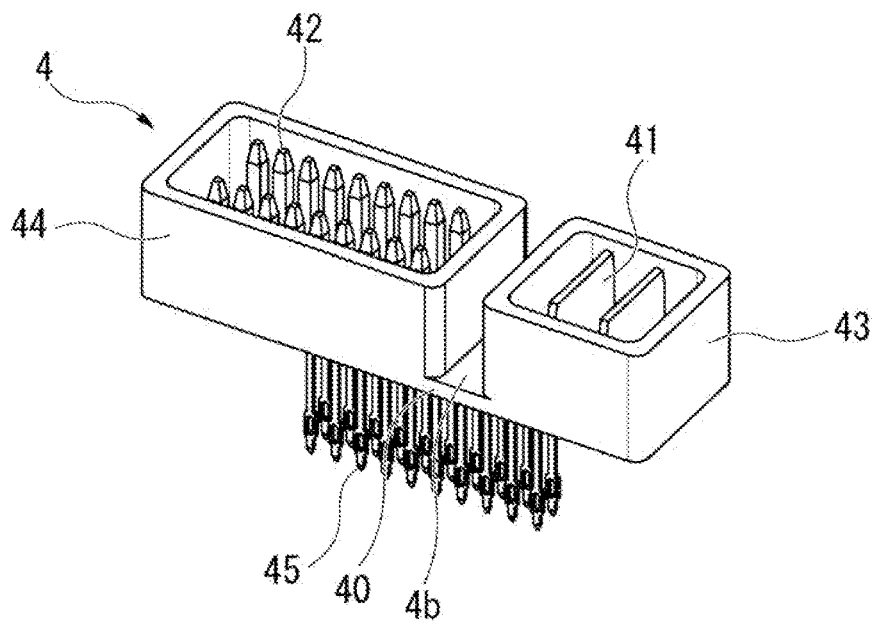
FIG. 4 An inclined view of the connector according to the first embodiment.

FIG. 3 and FIG. 4 are inclined views of the connector 4.

As shown in FIG. 3 and FIG. 4, the connector 4 includes a main body 40 that has a first surface 4a and a second surface 4b, power terminals 41 (connection terminals), signal terminals 42 (connection terminals), a power supply side housing 43, a signal side housing 44, a plurality of press-fit terminals 45, and a pair of first positioning protrusions 46. As shown in FIG. 1, the first surface 4a is a top side surface (the output side of rotating shaft 11) of the connector 4. The second surface 4b is a bottom side surface (the non-output side of rotating shaft 11) of the connector 4. FIG. 3 is a view of the connector 4 as seen from a first surface 4a side. FIG. 4 is a view of the connector 4 as seen from a second surface 4b side.

The power terminals 41 and the signal terminals 42 protrude from the second surface 4b of the main body 40. The power terminals 41 are connected to an outside power supply (battery). The signal terminals 42 are connected to sensors or the like on an outside of the circuit connection device 2. As shown in FIG. 1, the power terminals 41 and the signal terminals 42 extend towards the output side of rotating shaft 11.

Although the power terminals 41 and the signal terminals 42 in the present embodiment have differing shapes, both the power terminals 41 and the signal terminals 42 may have same shape terminals. Three types or more of differing terminal shapes may be used as the power terminals 41 and the signal terminals 42.

Although the power terminals 41 and the signal terminals 42 extend towards the output side of rotating shaft 11, the terminals thereof may extend towards the non-output side of rotating shaft 11.

The power supply side housing 43 is provided on the second surface 4b of the main body 40. The power supply side housing 43 is a container that has an opening, and houses the power terminals 41 on an inside. The power supply side housing 43 and the main body 40 are integrally formed.

The signal side housing 44 is provided on the second surface 4b of the main body 40. The signal side housing 44 is a container that has an opening, and houses the signal terminals 42 on an inside. The signal side housing 44 and the main body 40 are integrally formed.

Although the power supply side housing 43 and the signal side housing 44 are formed as separate containers in the present embodiment, it is possible to have the power supply side housing 43 and the signal side housing 44 be formed as an integral container. The power supply side housing 43 and the signal side housing 44 may also be formed from three or more separate containers. In other words, the power terminals 41 and the signal terminals 42 may be housed in a single container, or may be divided and housed in three or more containers.

The plurality of press-fit terminals 45 are provided so as to correspond to each of the power terminals 41 and the signal terminals 42. Press-fit terminals 45 are connected to the corresponding power terminals 41 or the signal terminals 42. The press-fit terminals 45 extend from the corresponding power terminals 41 or the signal terminals 42, and protrude from the first surface 4a of the main body 40. The press-fit terminals 45 extend towards the circuit board 3, as shown in FIG. 1 and FIG. 2. The press-fit terminals 45 extend towards the non-output side of rotating shaft 11.

Although the press-fit terminals 45 extend towards a direction opposite to the extension direction of the power terminals 41 and the signal terminals 42 in the present embodiment, the press-fit terminals 45 may extend in a direction orthogonal to the extension direction of the power terminals 41 and the signal terminals 42.

As a whole, the press-fit terminals 45 are shaped as long thin plates. Press-fit portions 45a are formed on tips of press-fit terminals 45. Widths (maximum widths) of the press-fit portions 45a are greater than widths of other portions of the press-fit terminals 45. Holes are formed on the press-fit portions 45a. As such, it is possible for the press-fit portions 45a to elastically deform.

The first positioning protrusions 46 protrude from the first surface 4a of the main body 40. The first positioning protrusions 46 as a whole are roughly formed as cylindrical columns. Tapered surfaces are provided on tips of the first positioning protrusions 46. In other words, the tips of first positioning protrusions 46 are tapered shapes that taper towards tips of first positioning protrusions 46.

The first positioning protrusions 46 extend so as to be parallel with the press-fit terminals 45. A pair of first positioning protrusions 46 is provided so as to sandwich the plurality of press-fit terminals 45. Lengths of first positioning protrusions 46 (in other words, a length of a portion out of portions of a first positioning protrusion 46 that protrudes from the first surface 4a) are shorter than lengths of press-fit terminals 45 (in other words, a length of a portion out of portions of a press-fit terminal 45 that protrudes from the first surface 4a). Therefore, the press-fit terminals 45 protrude towards a top direction more than the tips of first positioning protrusions 46.

Figure 5:
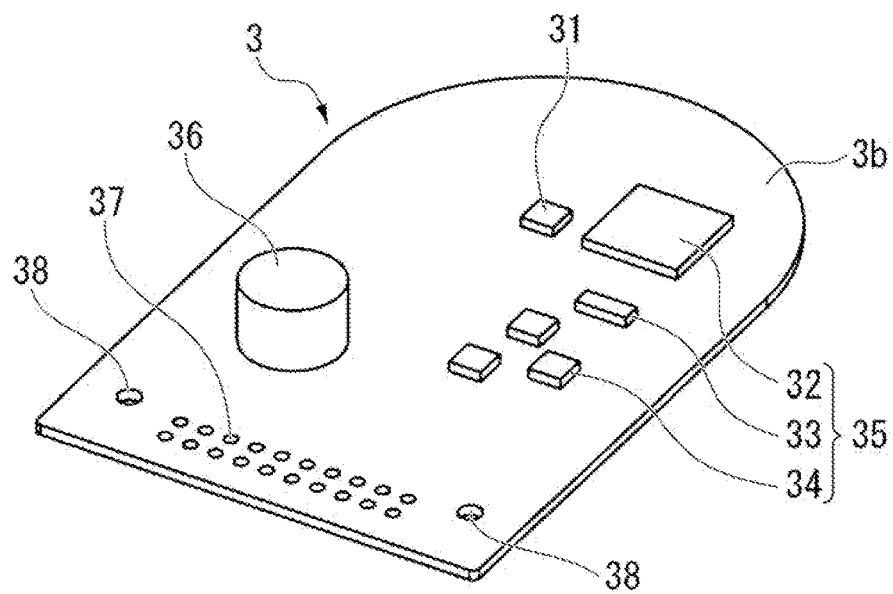
FIG. 5 An inclined view of a circuit board according to the first embodiment.

FIG. 5 is an inclined view of the circuit board 3.

As shown in FIG. 1 and FIG. 5, the circuit board 3 has a first surface 3a and a second surface 3b. The first surface 3a is a surface of a top side surface (the output side of rotating shaft 11) of the circuit board 3. The second surface 3b is a bottom side surface (the non-output side of rotating shaft 11) of the circuit board 3. FIG. 5 is a view of the circuit board 3 as seen from the second surface 3b.

The circuit board 3 is a printed wiring board. Small electronic components such as a rotation sensor 31, a microcomputer 32, a shunt resistor 33, and a switching element 34 or the like, and large electronic components such as a smoothing capacitor 36 or the like are mounted on the second surface 3b of the circuit board 3. The microcomputer 32, the shunt resistor 33, and the switching element 34 are heat generating electronic components. The microcomputer 32, the shunt resistor 33, and the switching element 34 are collectively referred to as "heat generating components 35".

The rotation sensor 31 is a magnetic sensor. As shown in FIG. 1, the rotation sensor 31 is provided to be coaxial with the sensor rotor 21 which is provided on the end surface of the non-output side of the rotating shaft 11. The sensor rotor 21 and the rotation sensor 31 face one another with a gap in between. The rotation sensor 31 detects changes in a magnetic field of the permanent magnets of the sensor rotor 21 that rotates along with the rotating shaft 11, and changes the detected changes into electrical signals. A state of rotation of rotating shaft 11 is detected by the sensor rotor 21 and the rotation sensor 31. A resolver, a hall sensor, or an optical sensor or the like may be used as the rotation sensor 31.

Going back to FIG. 5, a plurality of terminal through holes 37 are formed on the circuit board 3. The terminal through holes 37 penetrate the circuit board 3 from the first surface 3a to the second surface 3b. The plurality of terminal through holes 37 are located in a location that corresponds to the plurality of press-fit terminals 45. Inner diameters of terminal through holes 37 are smaller than the widths (maximum widths) of press-fit portions 45a. The plurality of press-fit terminals 45 are each press-inserted into the plurality of terminal through holes 37.

Conductive layers are formed on inner surfaces of terminal through holes 37. When the press-fit terminals 45 are press-inserted into the terminal through holes 37, the press-fit terminals 45 come into contact with, and are electrically connected to the conductive layers of the inner surfaces of the terminal through holes 37. By using the press-fit terminals 45, it is possible to electrically connect the circuit board 3 and the connector 4 without conducting any soldering or the like. Therefore, manufacturing of the circuit connection device 2 becomes easy, and it is possible to decrease the time required for manufacturing.

A pair of circuit board side through holes 38 (second positioning recesses) are formed on the circuit board 3. The circuit board side through holes 38 penetrate the circuit board 3 from the first surface 3a to the second surface 3b. The pair of circuit board side through holes 38 are provided so as to sandwich the plurality of terminal through holes 37.

Figure 6:
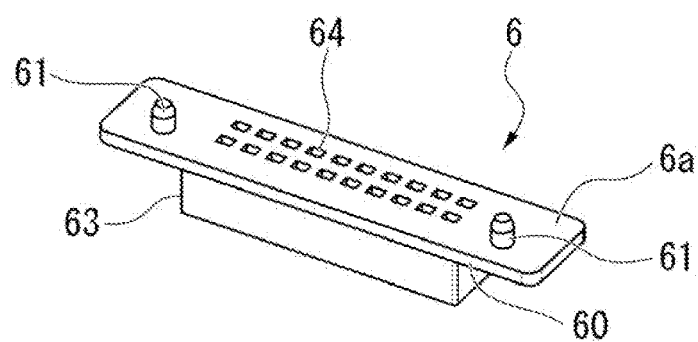
FIG. 6 An inclined view of a terminal alignment member according to the first embodiment.
Figure 7:
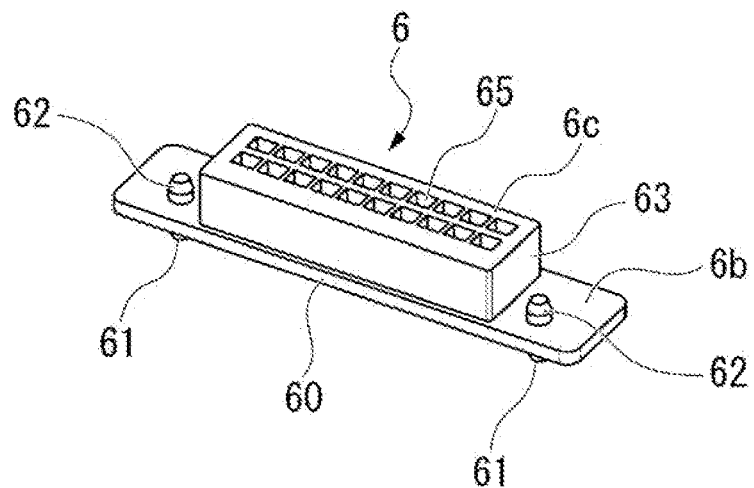
FIG. 7 An inclined view of the terminal alignment member according to the first embodiment.

FIG. 6 and FIG. 7 are inclined views of the terminal alignment member 6.

As shown in FIG. 6 and FIG. 7, the terminal alignment member 6 includes a main body 60 that has a first surface 6a and a second surface 6b, a pair of second positioning protrusions 61, a pair of third positioning protrusions 62, and a terminal guide 63. The first surface 6a is a top side surface (the output side of rotating shaft 11) of the terminal alignment member 6. The second surface 6b is a bottom side surface (the non-output side of rotating shaft 11) of the terminal alignment member 6. FIG. 6 is a view of the terminal alignment member 6 as seen from the first surface 6a. FIG. 7 is a view of the terminal alignment member 6 as seen from the second surface 6b.

The terminal guide 63 is a box shaped member. The terminal guide 63 is attached to the second surface 6b of the main body 60. A surface out of surfaces of the terminal guide 63 that is on an opposite side from the surface attached to the main body 60 is referred to as a "bottom surface 6c".

A plurality of guide through holes 64 are formed on the main body 60 and on the terminal guide 63. The guide through holes 64 penetrate the main body 60 and the terminal guide 63 in a top bottom direction. In other words, the guide through holes 64 penetrate the main body 60 and the terminal guide 63 from the first surface 6a to the bottom surface 6c. The plurality of guide through holes 64 are provided in locations that correspond to the plurality of terminal through holes 37. The guide through holes 64 communicate with the terminal through holes 37. Inner diameters of guide through holes 64 are larger than the inner diameters of the terminal through holes 37. The inner diameters of guide through holes 64 are larger than the widths (maximum widths) of the press-fit portions 45a. The guide through holes 64 guide the press-fit terminals 45 towards the terminal through holes 37.

Insertion guide holes 65 that incline and expand in dimeter as the insertion guide holes 65 move towards an open end of the connector 4 side of the guide through holes 64 (in other words, as the insertion guide holes 65 move towards the bottom surface 6c) are provided on an end of the bottom surface 6c side of the guide through holes 64.

The second positioning protrusions 61 protrude from the first surface 6a of the main body 60. As a whole, the second positioning protrusions 61 are roughly shaped as cylindrical columns. Tapered surfaces are provided on tips of the second positioning protrusions 61. In other words, the tips of the second positioning protrusions 61 are tapered shapes that taper towards the tips of the second positioning protrusions 61. A pair of the second positioning protrusions 61 are provided so as to sandwich the plurality of guide through holes 64.

The second positioning protrusions 61 are provided in a location that corresponds to the circuit board side through holes 38. The circuit board side through holes 38 and the second positioning protrusions 61 are disposed so as to be coaxial. The second positioning protrusions 61 are inserted through the circuit board side through holes 38.

The third positioning protrusions 62 protrude from the second surface 6b of the main body 60. As a whole, the third positioning protrusions 62 are roughly shaped as cylindrical columns. Tapered surfaces are provided on tips of the third positioning protrusions 62. In other words, the tips of the third positioning protrusions 62 are tapered shapes that taper towards the tips of the third positioning protrusions 62. A pair of the third positioning protrusions 62 are provided so as to sandwich the terminal guide 63.

Figure 8:
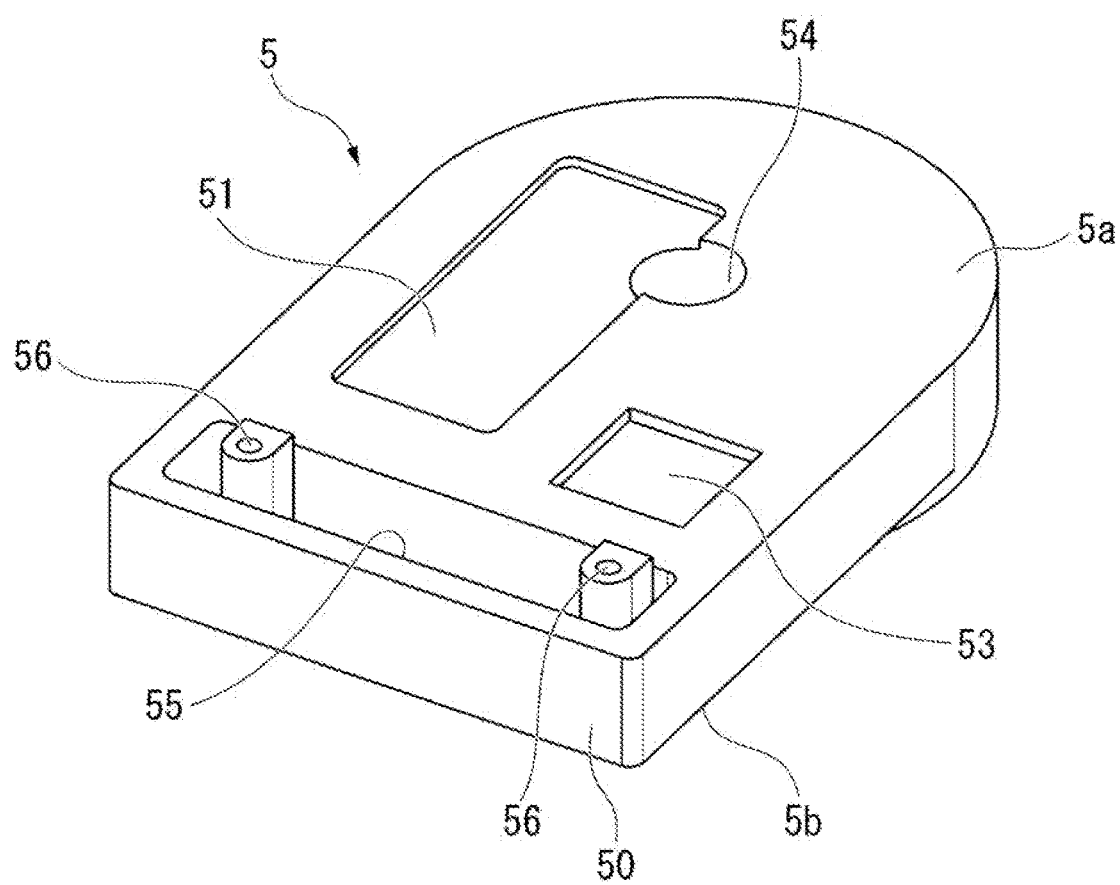
FIG. 8 An inclined view of a heat sink according to the first embodiment.

FIG. 8 is an inclined view of the heat sink 5.

As shown in FIG. 8, the heat sink 5 includes a main body 50 that has a first surface 5a and a second surface 5b, a heat dissipating portion 51, a large component storage portion 53, a rotating shaft through hole 54, an opening 55, and a pair of heat sink side through holes 56 (first positioning recess, third positioning recess). As shown in FIG. 1, the first surface 5a is a top side surface (the output side of the rotating shaft 11) of the heat sink 5. The second surface 5b is a bottom side surface (the non-output side of the rotating shaft 11) of the heat sink 5. FIG. 8 is a view of the heat sink 5 as seen from the first surface 5a.

As shown in FIG. 1, the heat sink 5 covers the top end of the case 14. The heat sink 5 acts as a lid that blocks an inside of the rotating electric machine 1. The circuit board 3 and the terminal alignment member 6 are attached to the first surface 5a of the heat sink 5. The connector 4 is attached to the second surface 5b of the heat sink 5.

Returning to FIG. 8, the heat dissipating portion 51 is a recess that is provided on the first surface 5a of the main body 50. The heat dissipating portion 51 is provided in a location that corresponds to the location the heat generating components 35 are mounted on in the circuit board 3. A heat dissipating grease 52 (refer to FIG. 1) is applied to the heat dissipating portion 51. When the circuit board 3 is attached to the heat sink 5, the heat generating components 35 are made to be in close contact with and covered with the heat dissipating grease 52. As such, heat of the heat generating components 35 is dissipated to the heat sink 5 through the heat dissipating grease 52.

The large component storage portion 53 is a recess that is provided on the first surface 5a of the main body 50. The large component storage portion 53 is provided in a location that corresponds to the location to which large electronic components of smoothing capacitor 36 or the like are mounted on in the circuit board 3. By providing the large component storage portion 53, it is possible to prevent interference between the heat sink 5 and the large electronic components of smoothing capacitor 36 or the like.

The rotating shaft through hole 54 penetrates the main body 50 from the first surface 5a to the second surface 5b. As shown in FIG. 1, the rotating shaft through hole 54 is provided in a location that corresponds to the rotating shaft 11. The end of the non-output side of the rotating shaft 11 is inserted through the rotating shaft through hole 54. The first bearing 19a is disposed inside the rotating shaft through hole 54. The sensor rotor 21 and the rotation sensor 31 face one another on the inside of the rotating shaft through hole 54, and it is possible to detect the state of rotation of the rotating shaft 11 by the sensor rotor 21 and the rotation sensor 31.

The opening 55 penetrates the main body 50 from the first surface 5a to the second surface 5b. The opening 55 is provided in a location that corresponds to the terminal guide 63. The terminal guide 63 is disposed on an inside of the opening 55.

The heat sink side through holes 56 penetrate the main body 50 from the first surface 5a to the second surface 5b. The pair of heat sink side through holes 56 are provided so as to sandwich the opening 55. The heat sink side through holes 56 are provided in locations that correspond to the first positioning protrusions 46 and the third positioning protrusions 62. The heat sink side through holes 56 are disposed so as to be coaxial with the first positioning protrusions 46 and with the third positioning protrusions 62. The first positioning protrusions 46 are inserted from the second surface 5b, and the third positioning protrusions 62 are inserted from the first surface 5a in the heat sink side through holes 56. Inner diameters of the heat sink side through holes 56 are set such that it is possible to press-insert the first positioning protrusions 46 and the third positioning protrusions 62 into the heat sink side through holes 56.

A height of the main body 50 (in other words, a length from the first surface 5a to the second surface 5b of the main body 50) is larger than a sum of a length of the first positioning protrusions 46 (in other words, a length from the first surface 4a of a protruding portion out of portions of the first positioning protrusions 46) and length of the third positioning protrusions 62 (in other words, a length from the second surface 6b of a protruding portion out of portions of the third positioning protrusions 62). Therefore, even if both the first positioning protrusions 46 and the third positioning protrusions 62 are inserted into the heat sink side through holes 56, it is possible to prevent collision between the first positioning protrusions 46 and the third positioning protrusions 62.

The height of the main body 50 is longer than a height of the terminal guide 63 (in other words, the length from the second surface 6b to the bottom surface 6c of the terminal guide 63). Therefore, the terminal guide 63 as a whole is housed inside of the opening 55.

Next, a manufacturing method of the circuit connection device 2 according to the first embodiment is explained with reference to FIG. 9 to FIG. 12. The manufacturing method of the circuit connection device 2 includes a first step of attaching the terminal alignment member 6 to the circuit board 3, a second step of attaching the circuit board 3 and the terminal alignment member 6 to the heat sink 5, and a third step of attaching the connector 4 to the heat sink 5. In the explanation below, a direction along a surface orthogonal to an extension direction of the press-fit terminals 45 (in other words, an extension direction of the first positioning protrusions 46) is referred to as a horizontal direction.

Figure 9:
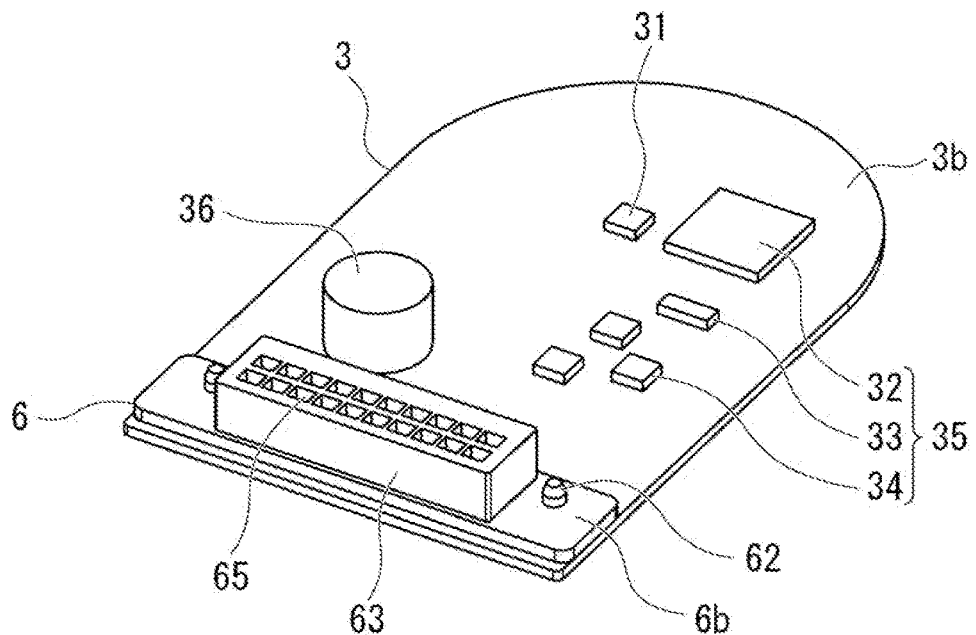
FIG. 9 A view explaining a first step of a manufacturing method of the circuit connection device according to the first embodiment.

FIG. 9 is a drawing that explains the first step.

In the first step, first, the circuit board 3 is disposed so as to have the second surface 3b become the top side. The terminal alignment member 6 is disposed such that the second surface 3b of the circuit board 3 and the first surface 6a of the main body 60 face one another. The second positioning protrusions 61 of the terminal alignment member 6 are inserted into the circuit board side through holes 38 of the circuit board 3. Since the tips of second positioning protrusions 61 are tapered shapes, it is possible to smoothly insert the second positioning protrusions 61 into the circuit board side through holes 38. By inserting the second positioning protrusions 61 into the circuit board side through holes 38, it is possible to adjust a location of the terminal alignment member 6 with respect to the circuit board 3 in the horizontal direction. As such, locations in the horizontal direction of the terminal through holes 37 and the guide through holes 64 are aligned so that centers of the terminal through holes 37 and centers of the guide through holes 64 coincide, and the terminal through holes 37 and the guide through holes 64 mutually communicate with one another.

Figure 10:
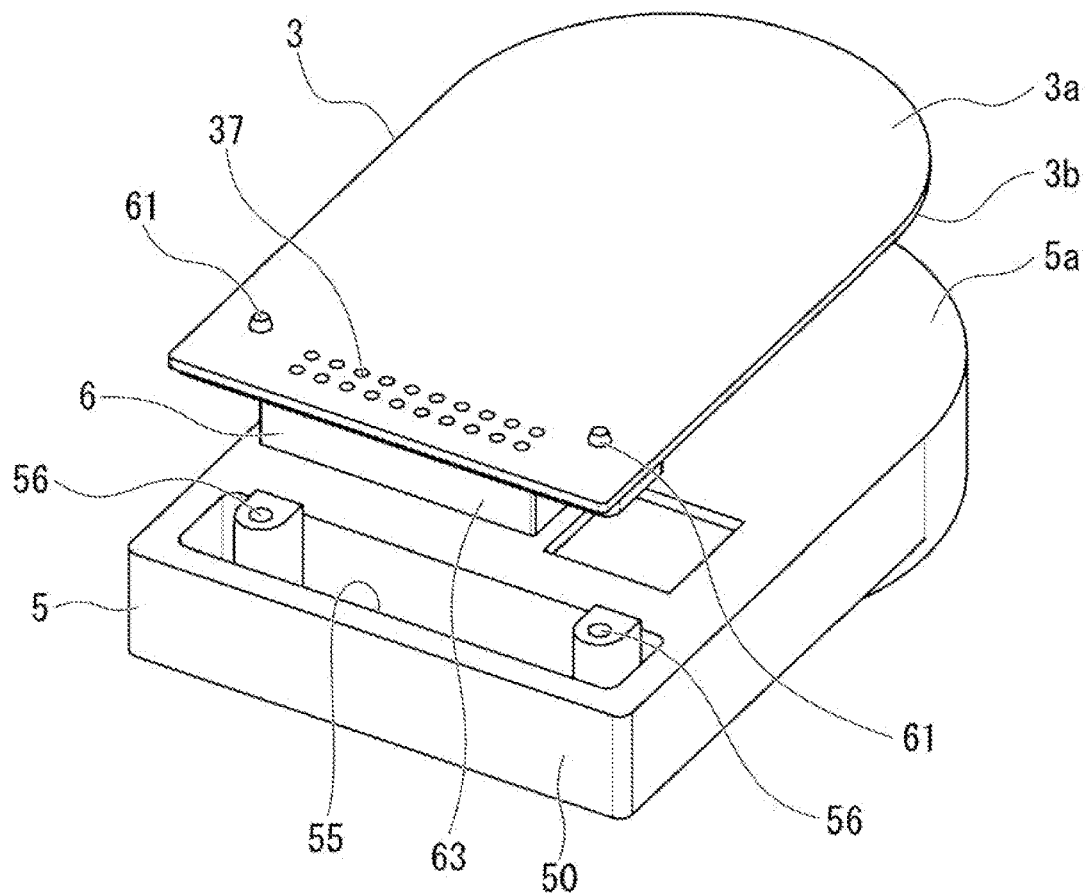
FIG. 10 A view explaining a second step of the manufacturing method of the circuit connection device according to the first embodiment.

FIG. 10 is a drawing that explains the second step.

In the second step, first, the heat sink 5 is disposed so as to have the first surface 5a become the top side. The circuit board 3 and the terminal alignment member 6 that were fixed to one another in the first step are inverted in a top-bottom direction, and the circuit board 3 and the terminal alignment member 6 are disposed such that the first surface 5a of the main body 50 and the second surface 3b of the circuit board 3 face one another. The third positioning protrusions 62 of the terminal alignment member 6 are inserted into the heat sink side through holes 56 of the heat sink 5. Since the tips of the third positioning protrusions 62 are tapered shapes, it is possible to smoothly insert the third positioning protrusions 62 into the heat sink side through holes 56. At such time, the terminal guide 63 is inserted into the opening 55. The main body 60 of the terminal alignment member 6 is sandwiched between the circuit board 3 and the heat sink 5. By inserting the third positioning protrusions 62 into the heat sink side through holes 56, it is possible to adjust the locations of the circuit board 3 and the terminal alignment member 6 with respect to the heat sink 5 in the horizontal direction. As such it is possible to align the locations in the horizontal direction of the heat dissipating portion 51 (heat dissipating grease 52) and the heat generating components 35 such that the heat dissipating portion 51 (heat dissipating grease 52) and the heat generating components 35 face one another. It is possible to align the locations in the horizontal direction of the large component storage portion 53 and the smoothing capacitor 36 such that the large component storage portion 53 and the smoothing capacitor 36 face one another. From the above, locations in the horizontal direction of the rotating shaft through hole 54 and the rotation sensor 31 are aligned, making it possible to prevent misalignment of the rotation sensor 31, which makes it possible to accurately detect the state of rotation of rotating shaft 11.

Afterwards, the circuit board 3 is pushed into the heat sink 5 by applying a load to the circuit board 3 in a direction orthogonal to the first surface 3a of the circuit board 3. As such the third positioning protrusions 62 are press-inserted and fixed to the heat sink side through holes 56. At such time, the heat dissipating grease 52 applied to the heat dissipating portion 51 of the heat sink 5 is spread out, and the heat generating components 35 are made to be in close contact with and covered with the heat dissipating grease 52. Since it is possible to spread out the heat dissipating grease 52 by push-inserting the third positioning protrusions 62, it is possible to simplify the assembly process. The smoothing capacitor 36 is disposed inside of the large component storage portion 53. The rotation sensor 31 is disposed on an inside of the rotating shaft through hole 54.

In a state where the circuit board 3 is pressed against the heat sink 5, the circuit board 3 and the terminal alignment member 6 are fixed to the heat sink 5 by fastening. Fixing the circuit board 3 and the terminal alignment member 6 with the heat sink 5 is not limited to fastening, and may be fixed by an adhesive, fixed by welding, fixed by brazing, fixed by soldering, or fixed by crimping and the like.

Figure 11:
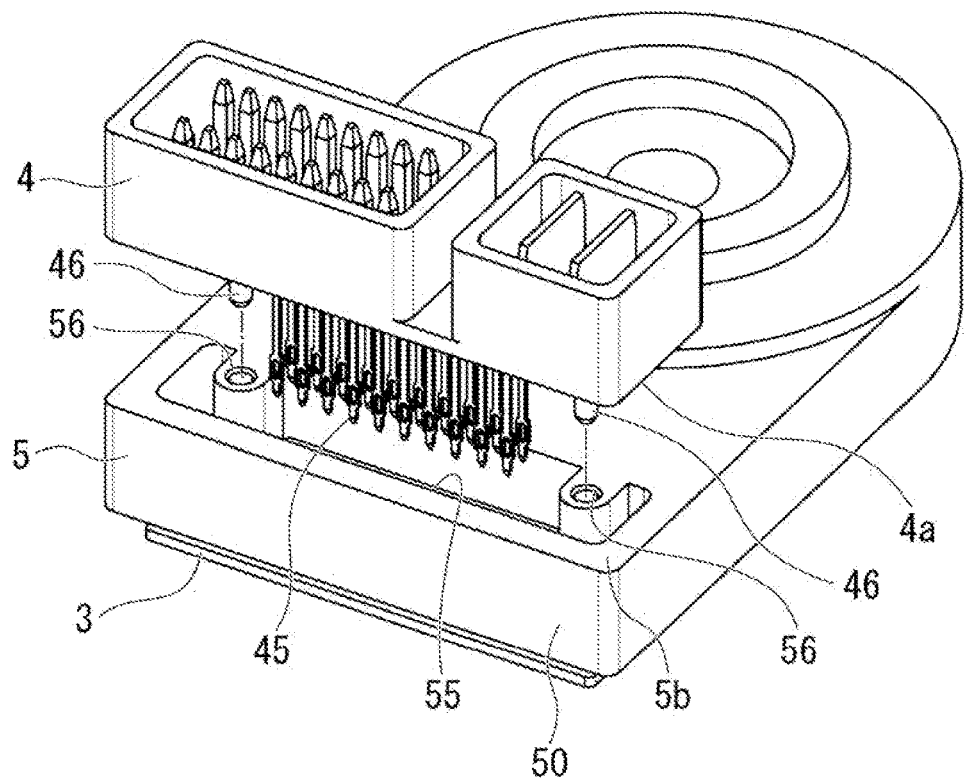
FIG. 11 A view explaining a third step of the manufacturing method of the circuit connection device according to the first embodiment.
Figure 12:
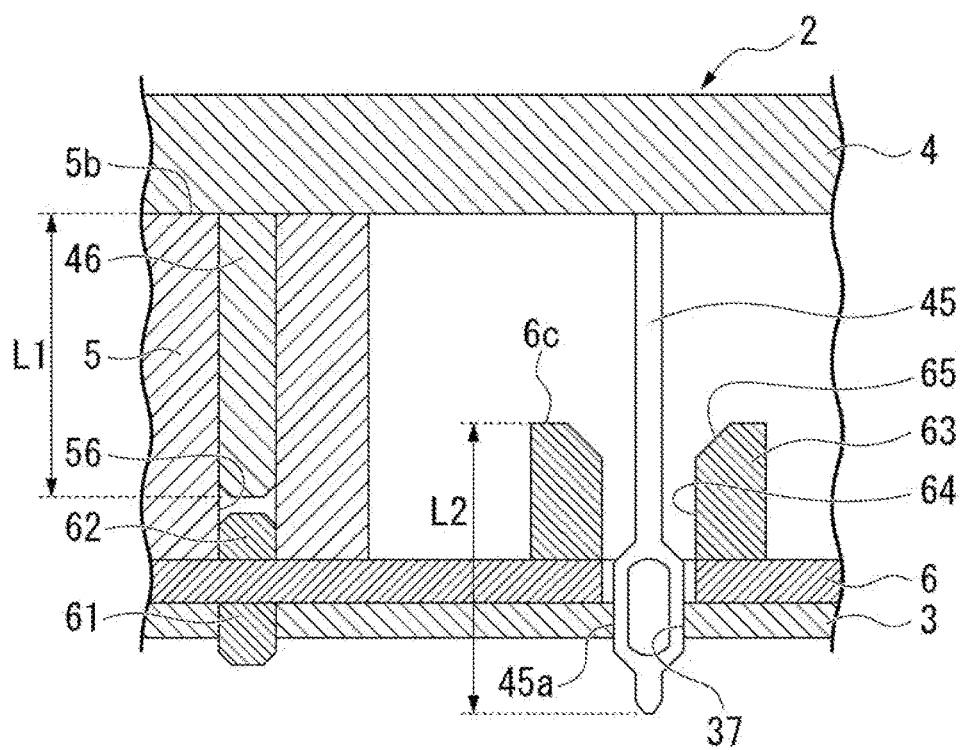
FIG. 12 A view explaining a third step of the manufacturing method of the circuit connection device according to the first embodiment.

FIG. 11 and FIG. 12 are drawings that explain the third step.

In the third step, the circuit board 3, the terminal alignment member 6 and the heat sink 5 that were fixed to one another in the second step are inverted in the top-bottom direction, and the circuit board 3, the terminal alignment member 6 and the heat sink 5 are disposed so that the second surface 5b of the main body 50 becomes the top side. The connector 4 is disposed so that the second surface 5b of the main body 50 and the first surface 4a of the main body 40 face one another. The first positioning protrusions 46 of the connector 4 are inserted into the heat sink side through holes 56 of the heat sink 5. Since the tips of the first positioning protrusions 46 are tapered shapes, it is possible to smoothly insert the first positioning protrusions 46 into the heat sink side through holes 56. By inserting the first positioning protrusions 46 into the heat sink side through holes 56, it is possible to adjust the location of the connector 4 with respect to the heat sink 5, the circuit board 3, and the terminal alignment member 6 in the horizontal direction. As such, locations in the horizontal direction of the press-fit terminals 45, the terminal through holes 37 and the guide through holes 64 are aligned so that centers of the press-fit terminals 45, the centers of the terminal through holes 37 and the centers of the guide through holes 64 coincide.

In such a state, the connector 4 is moved more towards the heat sink 5 side, and the press-fit terminals 45 are inserted into the guide through holes 64.

As shown in FIG. 12, a length in the extension direction of the press-fit terminals 45 from the tips of the first positioning protrusions 46 to the open end of the connector 4 side of the heat sink side through holes 56 is referred to as "L1". A length in the extension direction of the press-fit terminals 45, from tips of the press-fit terminals 45 to the open end of the connector 4 side of the guide through holes 64 is referred to as "L2". The length of L1 is longer than the length of L2. Therefore, when the step of inserting the first positioning protrusions 46 into the heat sink side through holes 56 is started, insertion of the press-fit terminals 45 into the guide through holes 64 is not started. In other words, it is possible to insert the press-fit terminals 45 into the guide through holes 64 after the locations in the horizontal direction of the press-fit terminals 45 and the guide through holes 64 are aligned, due to inserting the first positioning protrusions 46 into the heat sink side through holes 56. Therefore, it is possible to assuredly and smoothly insert the press-fit terminals 45 into the guide through holes 64. Since the insertion guide holes 65 are formed in the guide through holes 64, it is possible to more smoothly insert the press-fit terminals 45 into the guide through holes 64.

Afterwards, the connector 4 is moved more towards the heat sink 5 side. The press-fit terminals 45 move towards the circuit board 3 side while being guided along by the guide through holes 64, and the press-fit terminals 45 are inserted into the terminal through holes 37.

Afterwards, the connector 4 is pushed into the heat sink 5 by applying a load to the connector 4 in a direction orthogonal to the second surface 4b of the connector 4. As such, the press-fit terminals 45 are press-inserted and fixed to the terminal through holes 37. The first positioning protrusions 46 are press-inserted and fixed to the heat sink side through holes 56. Afterwards, the connector 4 is fixed to the heat sink 5 by fastening in a state where the connector 4 is pressed against the heat sink 5. Fixing the connector 4 with the heat sink 5 is not limited to fastening, and may be fixed by an adhesive, fixed by welding, fixed by brazing, fixed by soldering, or fixed by crimping and the like.

As explained above, in the circuit connection device 2 according to the present embodiment, the connector 4 has the power terminals 41 and the signal terminals 42 that are connected to the outside of the circuit connection device 2, and has the press-fit terminals 45 connected to the power terminals 41 and the signal terminals 42. The terminal through holes 37 into which the press-fit terminals 45 are press-inserted into are formed in the circuit board 3. The terminal alignment member 6 is disposed between the connector 4 and the circuit board 3, and is fixed to the circuit board 3. The terminal alignment member 6 has the terminal guide 63 in which the guide through holes 64 that guide the press-fit terminals 45 towards the terminal through holes 37 are formed. The circuit board 3 is fixed to the first surface 5a of the heat sink 5. The connector 4 is fixed to the second surface 5b which is on an opposite side of the first surface 5a. The heat sink 5 has the opening 55 that penetrates the heat sink 5 from the first surface 5a to the second surface 5b, and that houses the terminal guide 63 on the inside. The first positioning protrusions 46 are formed in the connector 4. The heat sink side through holes 56 that mate with the first positioning protrusions 46 are formed in the heat sink 5. The second positioning protrusions 61 are formed in the terminal alignment member 6. The circuit board side through holes 38 that mate with the second positioning protrusions 61 are formed in the circuit board 3. The third positioning protrusions 62 are formed in the terminal alignment member 6.

The heat sink side through holes 56 that mate with the third positioning protrusions 62 are formed in the heat sink 5.

The manufacturing method of the circuit connection device 2 according to the present embodiment includes the first step that has the second positioning protrusions 61 mated with the circuit board side through holes 38, and the terminal alignment member 6 fixed to the circuit board 3, the second step that has the third positioning protrusions 62 mated with the heat sink side through holes 56, the terminal guide 63 housed inside of opening 55, and the terminal alignment member 6 fixed to the heat sink 5, and the third step that has the first positioning protrusions 46 mated with the heat sink side through holes 56, and the connector 4 fixed to the heat sink 5 with the press-fit terminals 45 being inserted into the guide through holes 64 as well as the press-fit terminals 45 being press-inserted into the terminal through holes 37.

Since the press-fit terminals 45 are guided towards the terminal through holes 37 by the guide through holes 64, it is possible to assuredly insert the press-fit terminals 45 into the terminal through holes 37. Also, since the terminal guide 63 with the guide through holes 64 formed is disposed on the inside of opening 55 formed in the heat sink 5, even if the terminal alignment member 6 is provided, it is possible to prevent an increase in size of the circuit connection device 2.

The first positioning protrusions 46 are mated with the heat sink side through holes 56, the second positioning protrusions 61 are mated with the circuit board side through holes 38, and the third positioning protrusions 62 are mated with the heat sink side through holes 56. As such, it is possible to adjust relative locations of circuit board 3, the connector 4, the heat sink 5, and the terminal alignment member 6. Therefore, it is possible to easily, as well as accurately, assemble the circuit board 3, the connector 4, the heat sink 5, and the terminal alignment member 6 together.

Further, in a conventional terminal alignment member, to prevent collision of press-fit terminals and guide through holes as a result of misalignment in the relative locations of a connector and a circuit board, there is a need to make a diameter of an opening of the guide through holes larger for example. In the circuit connection device 2 according to the present embodiment, it is possible to adjust the relative locations of the circuit board 3, the connector 4, the heat sink 5, and the terminal alignment member 6 so that the press-fit terminals 45 are inserted into the guide through holes 64 in a state where locations of the press-fit terminals 45 and the locations of the guide through holes 64 are aligned. As a result, it is possible to assuredly insert the press-fit terminals 45 into the guide through holes 64 without increasing a size of the guide through holes 64, which makes it possible to prevent an increase in the size of the circuit connection device 2.

From the above, it is possible to achieve a decrease in the size and an improvement in the assemblability in the circuit connection device 2, according to the present embodiment.

It is possible to prevent the tips of the press-fit terminals 45 from colliding with the guide through holes 64 or the surroundings thereof, making it possible to prevent buckling of the press-fit terminals 45. Therefore, it is possible to provide a high quality circuit connection device 2.

To make insertion of the press-fit terminals 45 into the guide through holes 64 easier, it is possible for example, to provide the insertion guide holes 65 on the end of the connector 4 side of the guide through holes 64. Also, by making inclination angles of the insertion guide holes 65 smaller, it is possible to prevent buckling of the press-fit terminals 45. When the inclination angles of the insertion guide holes 65 are made smaller, a thickness of the terminal guide 63 becomes larger. However, in the circuit connection device 2 according to the present embodiment, since the terminal guide 63 is disposed on the inside of opening 55, even if the thickness of the terminal guide 63 is made larger, so long as the thickness thereof is in a range that is smaller than a thickness of the heat sink 5, it is possible to prevent an increase in the size of the circuit connection device 2.

The length L1 from the tips of the first positioning protrusions 46 to the open end of the connector 4 side of the heat sink side through holes 56 in the extension direction of the press-fit terminals 45 is longer than the length L2 from the tips of the press-fit terminals 45 to the open end of the connector 4 side of the guide through holes 64 in the extension direction of the press-fit terminals 45. As such, it is possible to insert the first positioning protrusions 46 into the heat sink side through holes 56, aligning the locations of the press-fit terminals 45 and the guide through holes 64, before inserting the press-fit terminals 45 into the guide through holes 64. As a result, it is possible to more assuredly and smoothly insert the press-fit terminals 45 into the guide through holes 64.

The pair of the first positioning protrusions 46 are provided so as to sandwich the press-fit terminals 45. The pair of the second positioning protrusions 61 are provided so as to sandwich the guide through holes 64. The pair of the third positioning protrusions 62 are provided so as to sandwich the guide through holes 64. As such, it is possible to more accurately align the locations of the press-fit terminals 45, the guide through holes 64, and the terminal through holes 37.

Second Embodiment

Hereinafter, the circuit connection device 2 according to a second embodiment is explained with reference to the drawings. Components having similar functions and effects as components in the first embodiment have the same reference signs affixed thereto, and explanations thereof are omitted.

Figure 13:
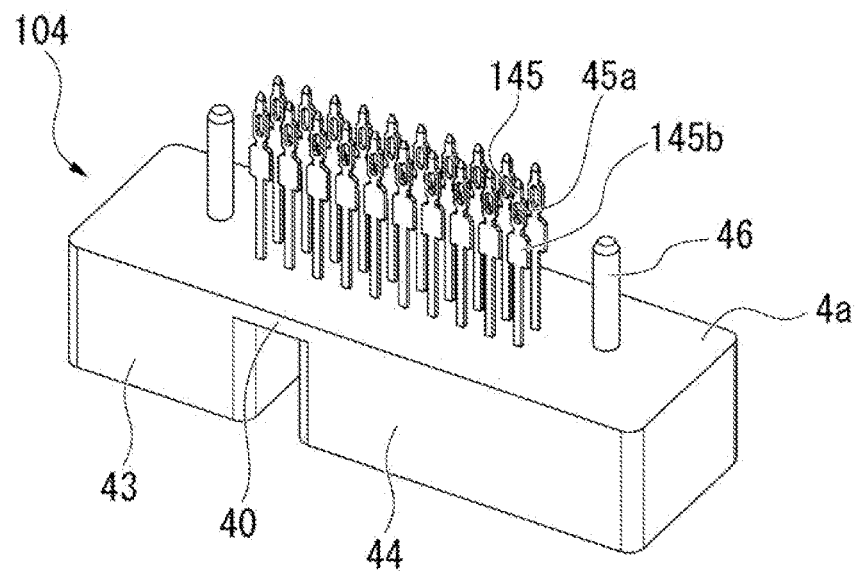
FIG. 13 An inclined view of the connector according to a second embodiment.
Figure 14:
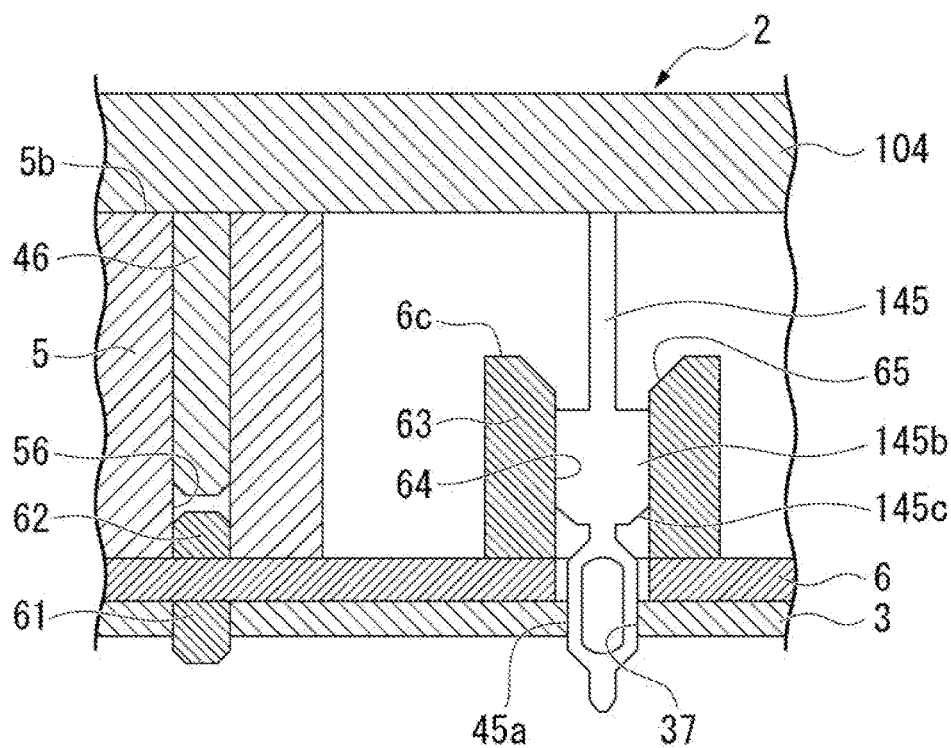
FIG. 14 A schematic cross-sectional view of the circuit connection device according to the second embodiment.

FIG. 13 is an inclined view of a connector 104 according to the second embodiment. FIG. 14 is a schematic cross-sectional view of the circuit connection device 2 according to the second embodiment.

The connector 104 according to the second embodiment has a plurality of press-fit terminals 145 in place of the press-fit terminals 45.

The press-fit terminals 145 include the press-fit portions 45a, and position regulators 145b. The position regulators 145b are formed more on a base side than the press-fit portions 45a. Widths (maximum widths) of the position regulators 145b are larger than the widths (maximum widths) of the press-fit portions 45a. The widths (maximum widths) of the position regulators 145b are slightly smaller than the inner diameters of the guide through holes 64. When the press-fit terminals 145 are inserted into the guide through holes 64, the position regulators 145b come into contact with the guide through holes 64. Tapered portions 145c having widths thereof that decrease moving towards tip sides of the press-fit terminals 145 are provided on tips of the position regulators 145b. In other words, the tips of the position regulators 145b are tapered shapes that taper towards the tips of the press-fit terminals 145. Angles of inclination of the tapered portions 145c with respect to tip surfaces of the position regulators 145b are for example, in the range of 10 degrees to 45 degrees.

A manufacturing method of the circuit connection device 2 according to the second embodiment is explained. Similar to the first embodiment, the manufacturing method of the circuit connection device 2 according to the second embodiment includes a first step of attaching the terminal alignment member 6 to the circuit board 3, a second step of attaching the circuit board 3 and the terminal alignment member 6 to the heat sink 5, and a third step of attaching the connector 104 to the heat sink 5. The first step and the second step are similar to the first step and the second step of the first embodiment, and explanations thereof are omitted.

In the third step, the circuit board 3, the terminal alignment member 6 and the heat sink 5 that were fixed to one another in the second step are inverted in the top-bottom direction, and the circuit board 3, the terminal alignment member 6 and the heat sink 5 are disposed so as to have the second surface 5b of the main body 50 become the top side. The connector 104 is disposed so that the second surface 5b of the main body 50 and the first surface 4a of the main body 40 face one another. The first positioning protrusions 46 of the connector 104 are inserted into the heat sink side through holes 56 of the heat sink 5. By inserting the first positioning protrusions 46 into the heat sink side through holes 56, it is possible to adjust the location of the connector 104 with respect to the heat sink 5, the circuit board 3 and the terminal alignment member 6 in the horizontal direction. As such, locations in the horizontal direction of the press-fit terminals 145, the terminal through holes 37 and the guide through holes 64 are aligned so that centers of the press-fit terminals 145, the centers of the terminal through holes 37 and the centers of the guide through holes 64 coincide.

In such a state, the connector 104 is moved more towards the heat sink 5 side, and the press-fit terminals 145 are inserted into the guide through holes 64. As insertion of the press-fit terminals 145 advances, the position regulators 145b of the press-fit terminals 145 are inserted into the guide through holes 64, and the position regulators 145b come into contact with the guide through holes 64. Since the tapered portions 145c are formed on the position regulators 145b, and the insertion guide holes 65 are formed on the guide through holes 64, it is possible to smoothly insert the position regulators 145b into the guide through holes 64 even in a case of wider position regulators 145b. By having the position regulators 145b come into contact with the guide through holes 64, movement of the press-fit terminals 145 is regulated in the horizontal direction. As such, the press-fit terminals 145 are more assuredly guided towards the terminal through holes 37, and it is possible to more assuredly and smoothly insert the press-fit terminals 145 (press-fit portions 45a) into the terminal through holes 37.

Afterwards, the connector 104 is pushed into the heat sink 5 by applying a load to the connector 104 in a direction orthogonal to the second surface 4b of the connector 104. As such, the press-fit terminals 145 are press-inserted and fixed to the terminal through holes 37. The first positioning protrusions 46 are press-inserted and fixed to the heat sink side through holes 56. Afterwards, the connector 104 is fixed to the heat sink 5 by fastening in a state where the connector 104 is pressed against the heat sink 5.

As explained above, in the circuit connection device 2 according to the second embodiment, the press-fit terminals 145 have the press-fit portions 45a press-inserted into the terminal through holes 37, and the position regulators 145b that come into contact with the guide through holes 64, and that are wider than the press-fit portions 45a.

By having the position regulators 145b come into contact with the guide through holes 64, movement of the press-fit terminals 145 is regulated, and it is possible to more assuredly guide the press-fit terminals 145 towards the terminal through holes 37. Therefore, it is possible to more assuredly and smoothly insert the press-fit terminals 145 into the terminal through holes 37. It is possible to prevent the tips of the press-fit terminals 145 from colliding with the guide through holes 64 or the terminal through holes 37, making it possible to more assuredly prevent buckling of the press-fit terminals 145.

Third Embodiment

Hereinafter, the circuit connection device 2 according to a third embodiment is explained with reference to the drawings. Components having similar functions and effects as components in the first embodiment have the same reference signs affixed thereto, and explanations thereof are omitted.

Figure 15:
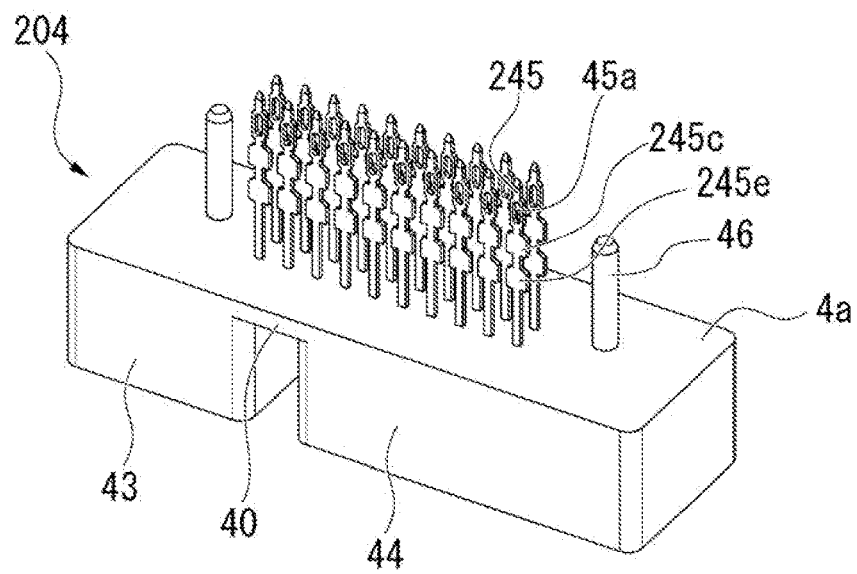
FIG. 15 An inclined view of the connector according to a third embodiment.
Figure 16:
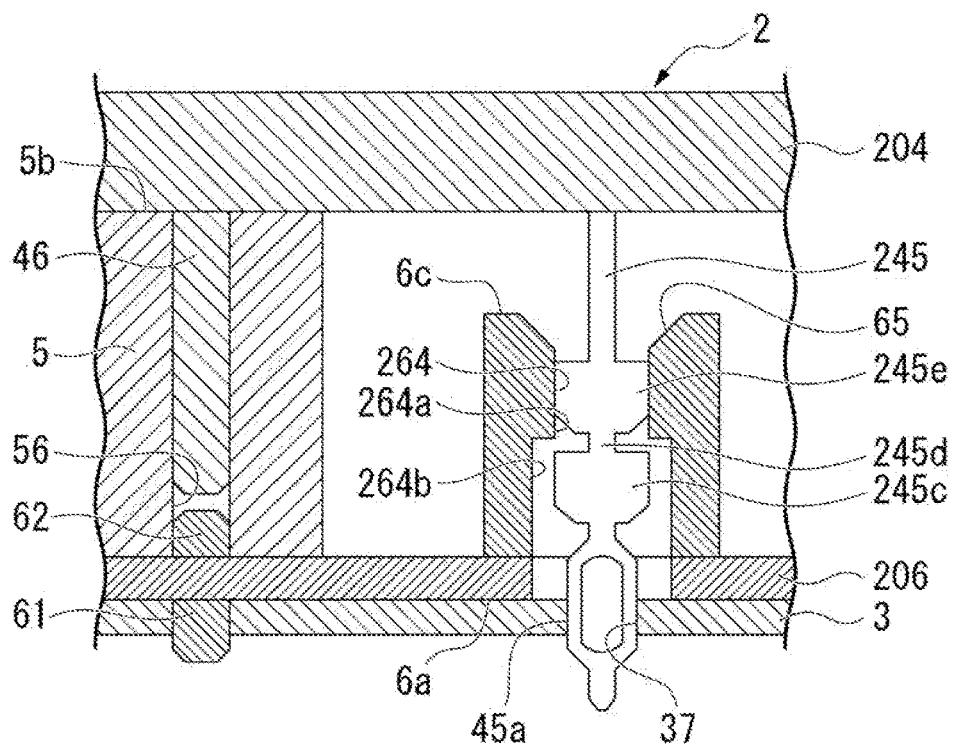
FIG. 16 A schematic cross-sectional view of the circuit connection device according to the third embodiment.

FIG. 15 is an inclined view of a connector 204 according to a third embodiment. FIG. 16 is a schematic cross-sectional view of the circuit connection device 2 according to the third embodiment.

The connector 204 according to the third embodiment has a plurality of press-fit terminals 245 in place of the press-fit terminals 45. A terminal alignment member 206 according to the third embodiment has guide through holes 264 in place of the guide through holes 64.

The press-fit terminals 245 include the press-fit portions 45a, first position regulators 245c, stress relief portions 245d, and second position regulators 245e. The press-fit portions 45a, the first position regulators 245c, the stress relief portions 245d, and the second position regulators 245e are provided in such an order, from tips of the press-fit terminals 245 towards a base side thereof. Tapered portions having widths thereof decrease moving towards tip sides of the press-fit terminals 245 are provided on the first position regulators 245c. Tapered portions having widths thereof decrease moving towards tip sides of the press-fit terminals 245 are provided on the second position regulators 245e. In other words, tips of the first position regulators 245c and tips of the second position regulators 245e become tapered shapes that taper towards the tips of the press-fit terminals 245.

Widths (maximum widths) of the first position regulators 245c and widths (maximum widths) of the second position regulators 245e are larger than the widths (maximum widths) of the press-fit portions 45a. The widths of the first position regulators 245c and the widths of the second position regulators 245e are the same. Widths of the stress relief portions 245d are smaller than the widths of the first position regulators 245c and the widths of the second position regulators 245e.

The guide through holes 264 have contact portions 264a and expansion portions 264b.

The contact portions 264a are provided on a bottom surface 6c of the guide through holes 264. Inner diameters of the contact portions 264a are slightly larger than the widths (maximum widths) of the first position regulators 245c, and the widths (maximum widths) of the second position regulators 245e. When the press-fit terminals 245 are inserted into the guide through holes 264, the first position regulators 245c and the second position regulators 245e come into contact with the contact portions 264a.

The expansion portions 264b are provided on the first surface 6a side of the guide through holes 264. Inner diameters of the expansion portions 264b are larger than the inner diameters of the contact portions 264a. The inner diameters of the expansion portions 264b are larger than the inner diameters of the terminal through holes 37. The inner diameters of the expansion portions 264b are larger than the widths of the first position regulators 245c and the widths of the second position regulators 245e. The first position regulators 245c are disposed on an inside of expansion portions 264b in a state where the first position regulators 245c do not come into contact with the expansion portions 264b (i.e. are separated from the expansion portions 264b) when the press-fit terminals 245 are press-inserted into the terminal through holes 37.

A manufacturing method of the circuit connection device 2 according to the third embodiment is explained. Similar to the first embodiment, the manufacturing method of the circuit connection device 2 according to the third embodiment includes a first step of attaching the terminal alignment member 206 to the circuit board 3, a second step of attaching the circuit board 3 and the terminal alignment member 206 to the heat sink 5, and a third step of attaching the connector 204 to the heat sink 5. The first step and the second step are similar to the first step and the second step of the first embodiment, and explanations thereof are omitted.

In the third step, the circuit board 3, the terminal alignment member 206 and the heat sink 5 that were fixed to one another in the second step are inverted in the top-bottom direction, and the circuit board 3, the terminal alignment member 206 and the heat sink 5 are disposed so as to have the second surface 5b of the main body 50 become the top side. The connector 204 is disposed so that the second surface 5b of the main body 50 and the first surface 4a of the main body 40 face one another. The first positioning protrusions 46 of the connector 204 are inserted into the heat sink side through holes 56 of the heat sink 5. By inserting the first positioning protrusions 46 into the heat sink side through holes 56, it is possible to adjust the location of the connector 204 with respect to the heat sink 5, the circuit board 3 and the terminal alignment member 206 in the horizontal direction. As such, locations in the horizontal direction of the press-fit terminals 245, the terminal through holes 37 and the guide through holes 264 are aligned so that centers of the press-fit terminals 245, the centers of the terminal through holes 37 and the centers of the guide through holes 264 coincide.

In such a state, the connector 204 is moved more towards the heat sink 5 side, and the press-fit terminals 245 are inserted into the guide through holes 264. As insertion of the press-fit terminals 245 advances, first, the first position regulators 245c of the press-fit terminals 245 come into contact with the contact portions 264a. From this, movement of the press-fit terminals 245 is regulated in the horizontal direction.

As insertion of the press-fit terminals 245 advances further, the second position regulators 245e come into contact with the contact portions 264a, and the first position regulators 245c are disposed on the inside of the expansion portions 264b. In such a state, the connector 204 is pushed into the heat sink 5 by applying a load to the connector 204 in a direction orthogonal to the second surface 4b of the connector 204. As such, the press-fit terminals 245 are press-inserted and fixed to the terminal through holes 37. At such a time, it is possible for the stress relief portions 245d to relieve the stresses that are generated when the press-fit terminals 245 are press-inserted into the terminal through holes 37. The first positioning protrusions 46 are fixed by being press-inserted into the heat sink side through holes 56.

Afterwards, in a state where the heat sink 5 is pressed against the connector 204, the connector 204 is fixed to the heat sink 5 by fastening.

As explained above, in the circuit connection device 2 according to the third embodiment, the press-fit terminals 145 have the press-fit portions 45a that are press-inserted into the terminal through holes 37, the first and second position regulators 245c, 245e that are wider than the press-fit portions 45a, the stress relief portions 245d that are smaller in width than the first and second position regulators 245c, 245e, and are provided between the first position regulators 245c and the second position regulators 245e. The guide through holes 264 have contact portions 264a that come into contact with the second position regulators 245e when the press-fit portions 45a are press-inserted into the terminal through holes 37, and the expansion portions 264b that have the first position regulators 245c disposed on an inside of the expansion portions 264b when the press-fit portions 45a are press-inserted into the terminal through holes 37.

By having the first position regulators 245c and the second position regulators 245e come into contact with the contact portions 264a, movement of the press-fit terminals 245 is regulated, and it is possible to more assuredly guide the press-fit terminals 245 towards the terminal through holes 37. Therefore, it is possible to more assuredly and smoothly insert the press-fit terminals 245 into the terminal through holes 37. The stresses that are generated when the press-fit terminals 245 are press-inserted into the terminal through holes 37 are relieved by the stress relief portions 245d. Therefore, it is possible to prevent excessive stresses from being applied to the press-fit terminals 245. As a result, it is possible to prevent bending from occurring in the press-fit terminals 245, and to improve a connection quality of the press-fit terminals 245 and the terminal through holes 37.

Fourth Embodiment

Hereinafter, the circuit connection device 2 according to a fourth embodiment is explained with reference to the drawings. Components having similar functions and effects as components in the first embodiment have the same reference signs affixed thereto, and explanations thereof are omitted.

Figure 17:
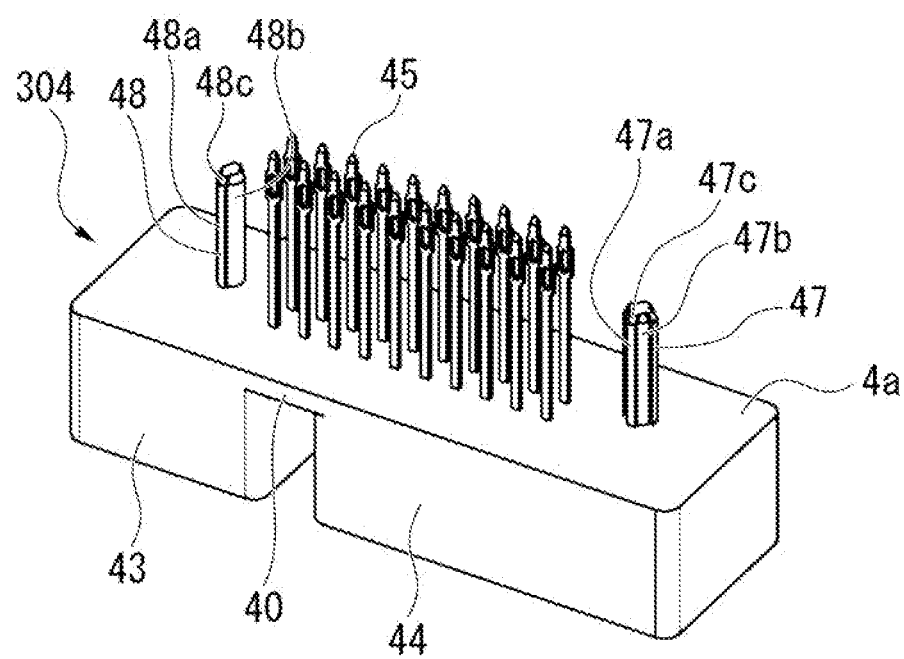
FIG. 17 An inclined view of the connector according to a fourth embodiment.
Figure 18:
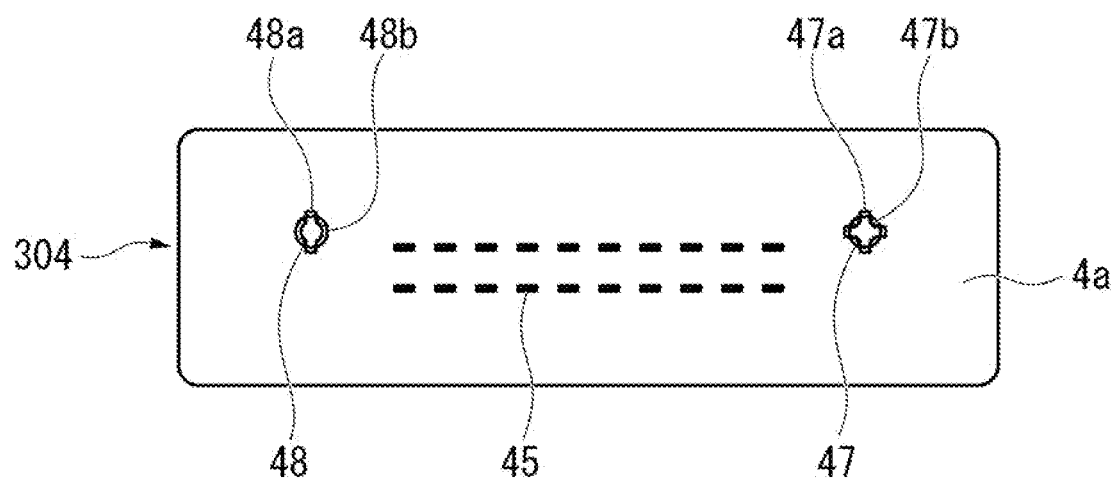
FIG. 18 A top view of the connector according to the fourth embodiment.

FIG. 17 is an inclined view of a connector 304 of the circuit connection device 2 according to the fourth embodiment. FIG. 18 is a top view of the connector 304.

The connector 304 according to the fourth embodiment has a fourth positioning protrusion 47 and a fifth positioning protrusion 48 in place of the pair of the first positioning protrusions 46.

The fourth positioning protrusion 47 has a column 47b, and a plurality (four in the present embodiment) of ribs 47a that protrude from the column 47b. The plurality of ribs 47a are disposed at equal intervals (90 degree intervals in the present embodiment) in the circumferential direction of the column 47b. Ribs 47a extend parallel to an axis line of the column 47b. The ribs 47a are provided in the overall length of the fourth positioning protrusion 47. Tapered surfaces 47c that taper towards tips of the fourth positioning protrusion 47 are provided on tips of the ribs 47a. In other words, the tips of the ribs 47a are tapered shapes towards the tips of the fourth positioning protrusion 47. The maximum diameter (in other words, an outer diameter of portions of the fourth positioning protrusion 47 to which the ribs 47a are provided on) of the fourth positioning protrusion 47 is smaller than an inner diameter of circuit board side through holes 38.

The fifth positioning protrusion 48 has column 48b and a plurality (two in the present embodiment) of ribs 48a that protrude from the column 48b. The plurality of ribs 48a are disposed at equal intervals (180 degree intervals in the present embodiment) in the circumferential direction of the column 48b. The ribs 48a are provided in the overall length of the fifth positioning protrusion 48. Tapered surfaces 48c that taper towards tips of the fifth positioning protrusion 48 are provided on tips of the ribs 48a. In other words, the tips of the ribs 48a are tapered shapes towards the tips of the fifth positioning protrusion 48. The maximum diameter (in other words, an outer diameter of portions of the fifth positioning protrusion 48 to which the ribs 48a are provided on) of the fifth positioning protrusion 48 is larger than an inner diameter of the circuit board side through holes 38.

Next, a manufacturing method of the circuit connection device 2 according to the fourth embodiment is explained. Similar to the first embodiment, the manufacturing method of the circuit connection device 2 according to the fourth embodiment includes a first step of attaching the terminal alignment member 6 to the circuit board 3, a second step of attaching the circuit board 3 and the terminal alignment member 6 to the heat sink 5, and a third step of attaching the connector 304 to the heat sink 5. The first step and the second step are similar to the first step and the second step of the first embodiment, and explanations thereof are omitted.

In the third step, the circuit board 3, the terminal alignment member 6 and the heat sink 5 that were fixed to one another in the second step are inverted in the top-bottom direction, and the circuit board 3, the terminal alignment member 6 and the heat sink 5 are disposed so as to have the second surface 5b of the main body 50 become the top side. The connector 304 is disposed so that the second surface 5b of the main body 50 and the first surface 4a of the main body 40 face one another. The fourth positioning protrusion 47 and the fifth positioning protrusion 48 of the connector 304 are inserted into the heat sink side through holes 56 of the heat sink 5. By inserting the fourth positioning protrusion 47 and the fifth positioning protrusion 48 into the heat sink side through holes 56, it is possible to adjust the location of the connector 304 with respect to the heat sink 5, the circuit board 3 and the terminal alignment member 6 in the horizontal direction.

In the present invention, the fourth positioning protrusion 47 has four ribs 47a. The fifth positioning protrusion 48 has two ribs 48a. By inserting the fourth positioning protrusion 47 into the circuit board side through holes 38, it is possible to adjust the location of the connector 304 with respect to the heat sink 5 in the horizontal direction. Also, by inserting the fifth positioning protrusion 48 into the circuit board side through holes 38, rotation of the connector 304 is regulated with respect to the heat sink 5, with the fourth positioning protrusion 47 acting as an axis of rotation.

In such a state, the connector 304 is moved more towards the heat sink 5 side, and the press-fit terminals 45 are inserted into the guide through holes 64. As insertion of the press-fit terminals 45 advances, the press-fit terminals 45 move towards the circuit board 3 side while being guided along by the guide through holes 64, and the press-fit terminals 45 are inserted into the terminal through holes 37.

Afterwards, the connector 304 is pushed into the heat sink 5 by applying a load to the connector 304 in a direction orthogonal to the second surface 4b of the connector 304. As such, the press-fit terminals 45 are press-inserted and fixed to the terminal through holes 37. The fourth positioning protrusion 47 and the fifth positioning protrusion 48 are press-inserted and fixed to the heat sink side through holes 56. The diameters of the ribs 47a, 48a of the fourth positioning protrusion 47 and the fifth positioning protrusion 48 are set so that a press-insertion load when press-inserting the fourth positioning protrusion 47 and the fifth positioning protrusion 48 into the heat sink side through holes 56 is less than the press-insertion load when press-inserting the press-fit terminals 45 into the terminal through holes 37. Afterwards, the connector 304 is fixed to the heat sink 5 by fastening in a state where the connector 304 is pressed against the heat sink 5.

Since a number of the ribs 48a of the fifth positioning protrusion 48 is less than the number of the ribs 47a of the fourth positioning protrusion 47, the connector 304 is not completely fixed to the heat sink 5 by the fifth positioning protrusion 48 and the circuit board side through holes 38. In other words, play exists between the fifth positioning protrusion 48 and the circuit board side through holes 38. As such, even if misalignment occurs between the fourth positioning protrusion 47, the fifth positioning protrusion 48, and the circuit board side through holes 38, it is possible to prevent the connector 304 from coming off.

Tips of the plurality of ribs 47a become tapered shapes that taper towards the tips of the fourth positioning protrusion 47. Tips of the plurality of ribs 48a become tapered shapes that taper towards the tips of the fifth positioning protrusion 48. As such, it is possible to easily insert the fourth positioning protrusion 47 and the fifth positioning protrusion 48 into the heat sink side through holes 56 and the circuit board side through holes 38. Even if the ribs 47a, and the ribs 48a are shaved off when press-inserting the fourth positioning protrusion 47 and the fifth positioning protrusion 48 into the circuit board side through holes 38, it is possible to prevent the generation of foreign objects.

In the present embodiment, although a configuration where ribs are provided in the positioning protrusions 47 and 48 of the connector 304 is explained, ribs may be provided in the second positioning protrusions 61 and in the third positioning protrusions 62 of the of the terminal alignment member 6.

Specifically, one of a pair of the second positioning protrusions 61 has a third column, and a plurality of third ribs that extend from the third column. The other of the pair of the second positioning protrusions 61 has a fourth column, and a plurality of fourth ribs that extend from the fourth column. The number of the plurality of third ribs for example may be four, and the number of the plurality of fourth ribs for example may be two. Tips of the plurality of third ribs and tips of the plurality of fourth ribs are tapered shapes that taper towards the tips of the second positioning protrusions 61.

Also, one of a pair of the third positioning protrusions 62 has a fifth column, and a plurality of fifth ribs that extend from the fifth column. The other of the pair of the third positioning protrusions 62 has a sixth column, and a plurality of sixth ribs that extend from the sixth column. The number of the plurality of fifth ribs for example may be four, and the number of the plurality of sixth ribs for example may be two. Tips of the plurality of fifth ribs and tips of the plurality of sixth ribs are tapered shapes that taper towards the tips of the third positioning protrusions 62.

It is possible to combine each of the previously mentioned embodiments, as well as change or omit any of the embodiments appropriately.

For example, in the above embodiments, the first positioning protrusions 46 are formed on the connector 4. The second positioning protrusions 61 and the third positioning protrusions 62 are formed on the terminal alignment member 6. The second positioning recesses are formed by the circuit board side through holes 38 penetrating the circuit board 3. First positioning recesses and third positioning recesses are formed by the heat sink side through holes 56 penetrating the heat sink 5. However, the present disclosure is not limited to the above. The first positioning protrusions may be formed on the heat sink 5, and the first positioning recesses may also be formed on the connector 4. The second positioning protrusions may be formed on the circuit board 3, and the second positioning recesses may be formed on the terminal alignment member 6. The third positioning protrusions may be formed on the heat sink 5, and the third positioning recesses may be formed on the terminal alignment member 6.

In the embodiments above, a load is applied to the circuit board 3, and by pushing the circuit board 3 onto the heat sink 5, the press-fit terminals 45 are press-inserted and fixed to the terminal through holes 37. However, depending on types of the press-fit terminals 45, pressure is applied in an axial direction from the tips of the press-fit terminals 45 to the press-fit terminals 45, and by widening the widths of the press-fit portions 45a, it is possible to crimp the press-fit terminals 45 to the terminal through holes 37.

In the above embodiments, the electronic components are mounted on the first surface 3a of the circuit board 3 which is a surface of the output side of the rotating shaft 11. However, the present disclosure is not limited to the above, and the electronic components may be mounted on the second surface 3b which is a surface of the non-output side of the rotating shaft 11. The heat dissipating grease 52 need not only be applied between the heat generating components 35 and the heat dissipating portion 51, but the space between the circuit board 3 and the heat sink 5 may entirely be filled with the heat dissipating grease 52.

The number of the plurality of ribs 47a are not limited to four, and the number of the plurality of ribs 48a is not limited to two. The number of the plurality of ribs 47a and the number of the plurality of ribs 48a may be the same.

The circuit connection device 2 is not limited to the rotating electric device A, and may be applied to an inverter device, a DC-DC converter device, and a microcomputer application control device or the like.

REFERENCE SIGNS LIST

1 . . . Rotating Electric Machine, 2 . . . Circuit Connection Device, 3 . . . Circuit Board, 4, 104, 204, 304 . . . connector, 5 . . . Heat Sink, 6, 206 . . . Terminal Alignment Member, 37 . . . Terminal Through Holes, 38 . . . Circuit Board Side Through Holes (Second Positioning Recesses), 41 . . . Power Terminals (Connection Terminals), 42 . . . Signal Terminals (Connection Terminals), 45, 145, 245 . . . Press-Fit Terminals, 45a . . . Press-Fit Portions, 46 . . . First Positioning Protrusions, 47 . . . Fourth Positioning Protrusion (One of a Pair of First Positioning Protrusions), 47a . . . Ribs (First Ribs), 47b . . . Column (First Column), 48 . . . Fifth Positioning Protrusion (The Other of a Pair of First Positioning Protrusions), 48a . . . Ribs (Second Ribs), 48b . . . Column (Second Column), 55 . . . Opening, 56 . . . Heat Sink Side Through Holes (First Positioning Recesses, Third Positioning Recesses), 61 . . . Second Positioning Protrusions, 62 . . . Third Positioning Protrusions, 63 . . . Terminal Guide, 64 . . . Guide Through Holes, 145b . . . Position Regulators, 245c . . . First Position Regulators, 245d . . . Stress Relief Portions. 245e . . . Second Position Regulators. 264a . . . Contact Portions. 264b . . . Expansion Portions. A . . . Rotating Electric Device

The invention claimed is:

1. A circuit connection device comprising:
a connector having connection terminals that are connected to an outside of the circuit connection device, and press-fit terminals that are connected to the connection terminals;
a circuit board that has terminal through holes formed, and the press-fit terminals are press-inserted into the terminal through holes;
a terminal alignment member having a terminal guide that has guide through holes formed, where the guide through holes guide the press-fit terminals towards the terminal through holes, and the terminal alignment member is fixed to the circuit board while being disposed between the connector and the circuit board, and
a heat sink that has an opening which houses the terminal guide on an inside of the opening, and the opening penetrates from a first surface to a second surface, where the circuit board is fixed to the first surface, and the connector is connected to the second surface that is on an opposite side of the first surface, wherein
first positioning protrusions are formed on one of the connector or the heat sink, and first positioning recesses that mate with the first positioning protrusions are formed on the other of the connector or the heat sink,
second positioning protrusions are formed on one of the circuit board or the terminal alignment member, and second positioning recesses that mate with the second positioning protrusions are formed on the other of the circuit board or the terminal alignment member, and
third positioning protrusions are formed on one of the heat sink or the terminal alignment member, and third positioning recesses that mate with the third positioning protrusions are formed on the other of the heat sink or the terminal alignment member.

2. The circuit connection device according to claim 1, wherein
the first positioning protrusions extend so as to be parallel with the press-fit terminals in the connector,
the second positioning protrusions and the third positioning protrusions are formed in the terminal alignment member,
the second positioning recesses are circuit board side through holes that are formed so as to penetrate the circuit board, and
the first positioning recesses and the third positioning recesses are heat sink side through holes that are formed so as to penetrate the heat sink.

3. The circuit connection device according to claim 2, wherein
lengths of the press-fit terminals in the extension direction from tips of the first positioning protrusions to an open end of the connector side of the heat sink side through holes are longer than the lengths of the press-fit terminals in the extension direction from tips of the press-fit terminals to an open end of the connector side of the guide through holes.

4. The circuit connection device according to claim 2, wherein
a pair of first positioning protrusions that includes the first positioning protrusions is formed in the connector, and the pair of first positioning protrusions are provided so as to sandwich the press-fit terminals.

5. The circuit connection device according to claim 4, wherein
one of the pair of first positioning protrusions has a first column, and a plurality of first ribs that extend from the first column,
the other of the pair of first positioning protrusions has a second column, and a plurality of second ribs that extend from the second column, and
a number of the plurality of second ribs is less than a number of the plurality of first ribs.

6. The circuit connection device according to claim 5, wherein
tips of the plurality of first ribs and tips of the plurality of second ribs become tapered shapes that taper towards tips of the first positioning protrusions.

7. The circuit connection device according to claim 2, wherein
a pair of second positioning protrusions that includes the second positioning protrusions is formed in the terminal alignment member, and
the pair of second positioning protrusions are provided so as to sandwich the guide through holes.

8. The circuit connection device according to claim 7, wherein
one of the pair of second positioning protrusions has a third column, and a plurality of third ribs that extend from the third column,
the other of the pair of second positioning protrusions has a fourth column, and a plurality of fourth ribs that extend from the fourth column, and
a number of the plurality of fourth ribs is less than a number of the plurality of third ribs.

9. The circuit connection device according to claim 8, wherein
tips of the plurality of third ribs and tips of the plurality of fourth ribs become tapered shapes that taper towards tips of the second positioning protrusions.

10. The circuit connection device according to claim 2, wherein
a pair of third positioning protrusions that includes the third positioning protrusions is formed in the terminal alignment member, and
the pair of third positioning protrusions are provided so as to sandwich the guide through holes.

11. The circuit connection device according to claim 10, wherein
one of the pair of third positioning protrusions has a fifth column, and a plurality of fifth ribs that extend from the fifth column,
the other of the pair of third positioning protrusions has a sixth column, and a plurality of sixth ribs that extend from the sixth column, and
a number of the plurality of sixth ribs is less than a number of the plurality of fifth ribs.

12. The circuit connection device according to claim 11, wherein
tips of the plurality of fifth ribs and tips of the plurality of sixth ribs become tapered shapes that taper towards the tips of third positioning protrusions.

13. The circuit connection device according to claim 1, wherein
the press-fit terminals have press-fit portions that are press-fit into the terminal through holes, and
position regulators that come into contact with the guide through holes, and that are wider than the press-fit portions.

14. The circuit connection device according to claim 1, wherein
the press-fit terminals have:
the press-fit portions press-inserted into the terminal through holes;
first and second position regulators that are wider than the press-fit portions, and
stress relief portions that are provided between the first position regulators and the second position regulators, and that have smaller widths than the widths of the first and the second position regulators,
and
the guide through holes have:
contact portions to which the second position regulators come into contact with when the press-fit portions are press-inserted into the guide through holes, and
expansion portions that have the first position regulators disposed on an inside of the expansion portions when the press-fit portions are press-inserted into the terminal through holes, and that have inner diameters that are larger than the inner diameters of the contact portions.

15. The circuit connection device according to claim 1, wherein
the circuit board is attached to the heat sink by fastening.

16. The circuit connection device according to claim 1, wherein
the connector is attached to the heat sink by fastening.

17. A rotating electric device comprising:
a rotating electric machine, and
the circuit connection device according to claim 1 that controls the rotating electric machine.

18. A method of manufacturing a circuit connection device wherein the circuit connection device includes: a connector having connection terminals that are connected to an outside of the circuit connection device, and press-fit terminals that are connected to the connection terminals; a circuit board that has terminal through holes formed, and the press-fit terminals are press-inserted into the terminal through holes; a terminal alignment member having a terminal guide that has guide through holes formed, where the guide through holes guide the press-fit terminals towards the terminal through holes, and the terminal alignment member is fixed to the circuit board while being disposed between the connector and the circuit board, and a heat sink that has an opening which houses the terminal guide on an inside of the opening, and the opening penetrates from a first surface to a second surface, where the circuit board is fixed to the first surface, and the connector is connected to the second surface that is on an opposite side of the first surface, wherein first positioning protrusions are formed on one of the connector or the heat sink, and first positioning recesses that mate with the first positioning protrusions are formed on the other of the connector or the heat sink, second positioning protrusions are formed on one of the circuit board or the terminal alignment member, and second positioning recesses that mate with the second positioning protrusions are formed on the other of the circuit board or the terminal alignment member, and third positioning protrusions are formed on one of the heat sink or the terminal alignment member, and third positioning recesses that mate with the third positioning protrusions are formed on the other of the heat sink or the terminal alignment member, the manufacturing method comprises:

a first step of mating the second positioning protrusions with the second positioning recesses, and of fixing the terminal alignment member to the circuit board;

a second step of mating the third positioning protrusions with the third positioning recesses, of housing the terminal guide on an inside of the opening, and of fixing the terminal alignment member to the heat sink, and a third step of mating the first positioning protrusions with the first positioning recesses, of inserting the press-fit terminals into the guide through holes while press-fitting the press-fit terminals into the terminal through holes, and of fixing the connector to the heat sink.

* * * * *